United States Patent [19]
Utsugi

[11] Patent Number: 5,837,391
[45] Date of Patent: Nov. 17, 1998

[54] ORGANIC ELECTROLUMINESCENT ELEMENT HAVING ELECTRODE BETWEEN TWO FLUORESCENT MEDIA FOR INJECTING CARRIER THEREINTO

[75] Inventor: Koji Utsugi, Tokyo, Japan

[73] Assignee: NEC Corporation, Tokyo, Japan

[21] Appl. No.: 784,791

[22] Filed: Jan. 16, 1997

[30] Foreign Application Priority Data

Jan. 17, 1996 [JP] Japan .................................. 8-005493

[51] Int. Cl.⁶ .................................................. H05B 33/14
[52] U.S. Cl. ...................... 428/690; 313/503; 313/504; 313/505; 313/506; 428/917
[58] Field of Search .................................. 428/690, 917; 313/504, 505, 506, 503

[56] References Cited

U.S. PATENT DOCUMENTS 5,141,671  8/1992  Bryan et al. .
5,294,870  3/1994  Tang et al. .

FOREIGN PATENT DOCUMENTS 6-9953    1/1994  Japan .
6-151063  5/1994  Japan .
6-163158  6/1994  Japan .
7-57873   3/1995  Japan .
7-142169  6/1995  Japan .

OTHER PUBLICATIONS

C.W. Tang et al., "Organic electroluminescent diodes", *Appl. Phys. Lett.*, vol. 51, No. 12, Sep. 21, 1987, pp. 913–915.

Sato et al., "Stability of Organic Electroluminescent Diodes", *Pro. of 253rd Meetings of Fluorescent Society*, Mitsubishi Chemical Corp., Yokohama Researh Center, Nov. 25, 1994, pp. 1–9.

S. Egusa, "Current Injection Mechanism of Organic Thin-Film Electroluminescence Device", *Applied Physics*, vol. 64, No. 12, Dec. 1995, pp. 1230–1233.

Okawara et al., "Dyestuff Handbook", Mar. 24, 1989, pp. 85, 108–109, 148–149, 236–237, 324–325, 328–329, 342–343, 346–347, 376–377, 382–383, 416–417, 420–421 424–425, 444–445, 450–451.

*Primary Examiner*—John M. Cooney, Jr.
*Attorney, Agent, or Firm*—Sughrue, Mion, Zinn, Macpeak & Seas, PLLC

[57] ABSTRACT

An organic electroluminescent element has a semi-transparent anode or a semi-transparent cathode inserted between luminescent media for injecting holes thereinto, and the semi-transparent anode or the semi-transparent cathode improves the carrier injecting efficiency so as to enhance the luminance.

18 Claims, 20 Drawing Sheets

ORGANIC ELECTROLUMINESCENT ELEMENT HAVING ELECTRODE BETWEEN TWO FLUORESCENT MEDIA FOR INJECTING CARRIER THEREINTO

FIELD OF THE INVENTION

This invention relates to an organic electroluminescent element and, more particularly, to an organic electroluminescent element available for producing a white/full color image.

DESCRIPTION OF THE RELATED ART

C. W. Tang and S. A. Vanslyke reported an organic electroluminescent diode in "Organic electroluminescent diodes", Applied Physics Letters, vol. 51 (12), pages 913 to 915, 21 Sept. 1987. The organic electroluminescent diode had a double-layer structure of organic thin films between an indium-thin-oxide anode and an alloyed Mg—Ag cathode, and achieved high external quantum efficient at 1 percent for photon/electron, luminous efficiency at 1.5 lm/W and brightness greater than 1000 cd/m$^2$.

The organic thin films and the fabrication technologies have been improved after the organic electroluminescent diode proposed by Tang et. al., and organic electroluminescent diodes presently available put in colors to emitted light. The primary three colors are obtained, and research and development efforts have been made on a full-color organic electroluminescent element.

One of the full-color technologies is to laminate an organic thin film for blue light, an organic thin film for red light and organic thin film for green light on one another as reported in Proceedings of 253rd Meetings of 1994 Fluorescent Society, pages 1 to 8 and Japanese Patent Publication of Unexamined Application No. 7-142169.

FIG. 1 illustrates a multi-layer structure of organic thin films. The prior art organic electro-luminescent element is fabricated on a substrate 1, and forms a pixel in a screen of a display unit. A semi-transparent anode 2a is formed on the substrate 1, and the multi-layer structure 3 of organic thin films is formed on the semi-transparent anode 2a. A hole transporting layer 3a, a blue luminescent layer 3b doped with blue fluorescent coloring agent and a green luminescent layer 3c form the multi-layer structure 3, and a cathode 2b is provided on the red luminescent layer. The green luminescent layer 3c is partially doped with green fluorescent coloring agent and partially doped with red fluorescent coloring agent 3d. The semi-transparent anode 2a and the cathode 2b inject holes and electrons into the multi-layer structure 3, and the electrons are recombined with the holes in the luminescent layers 3b/3c. Then, the blue, green luminescent media 3b and 3c illuminate lights different in spectrum, and the lights different in spectrum are mixed with one another for white light.

It is not necessary to two-dimensionally arrange the organic thin films, and color filters (not shown) separate the white light into the primary three colors. For this reason, the thin organic films are formed over the substrate 1 without a patterning.

Japanese Patent Publication of Unexamined Application No. 7-57873 discloses another organic electroluminescent element for emitting white light, and FIG. 2 illustrates the prior art organic electroluminescent element disclosed in the Japanese Patent Publication of Unexamined Application. The prior art organic electroluminescent element is fabricated on a substrate 10, and forms a pixel on a screen of a display unit. Three organic electroluminescent cells 11, 12 and 13 are stacked on the substrate 10, and transparent insulating plates 14a and 14b are inserted between the organic electroluminescent cells 11, 12 and 13.

The organic electroluminescent cell 11 includes a transparent anode 11a, a transparent cathode 11b, a hole transporting layer 11c and an electron transporting layer 11d formed of organic fluorescent material for blue light. The hole transporting layer 11c is formed on the transparent anode 11a, and the electron transporting layer 11d is provided between the hole transporting layer 11c and the transparent cathode 11b.

The organic electroluminescent cell 12 also includes a transparent anode 12a, a transparent cathode 12b, a hole transporting layer 12c and an electron transporting layer 12d formed of organic fluorescent material for green light. The hole transporting layer 12c is formed on the transparent anode 12a, and the electron transporting layer 12d is provided between the hole transporting layer 12c and the transparent cathode 12b.

The organic electroluminescent cell 13 also includes a transparent anode 13a, a cathode 13b, a hole transporting layer 13c and an electron transporting layer 13d formed of organic fluorescent material for red light. The hole transporting layer 13c is formed on the transparent anode 13a, and the electron transporting layer 13d is provided between the hole transporting layer 13c and the cathode 13b.

When a driving potential is applied between the anodes 11a–13a and the cathodes 11b to 13b, the electrons are recombined with the holes at the boundaries between the hole transporting layers 11c to 13c and the electron transporting layers 11d to 13d, and blue light, green light and red light are emitted from the boundaries.

Both organic electroluminescent elements shown in FIGS. 1 and 2 are simple in structure, and easily achieve white light and a full-color image. However, the prior art organic electroluminescent elements encounter a problem in uncontrollable tint of light emitted from the organic thin films. In detail, in order to balance the luminances of the primary three colors for the white light, the manufacturer is expected to exactly regulate the fluorescent coloring agents in the organic thin films 3a to 3c of the first prior art organic electroluminescent element to target values. However, such an exact regulation is not easy. On the other hand, the second prior art organic electroluminescent element shown in FIG. 2 regulates the spectra of the emitted lights by selecting the organic fluorescent materials for the electron transporting layers 11d to 13d, and it is impossible to exactly regulate the spectra of the emitted lights.

Moreover, the driving potential between the anode 2a and the cathode 2b unevenly affect the luminances of the emitted lights. The first prior art organic electroluminescent element applies the driving potential on both sides of the multi-layer structure 3, and the blue luminescent layer 3a, the green luminescent layer 3b and the luminescent layer doped with the red fluorescent coloring agent 3d are differently biased. The differently biased luminescent layers 3b, 3c and 3d make the regulation of tint complicated.

Another problem inherent in the prior art organic electroluminescent elements is a low electron-to-photon converting efficiency.

The first prior art organic electroluminescent element has a problem in a large driving potential. The large driving potential is derived from the two kinds of fluorescent coloring agents mixed into the organic luminescent layer 3c. The two kinds of fluorescent coloring agent generate a large amount of trapping level, and the large amount of trapping level causes the first prior art organic electroluminescent element to require the large driving potential.

The second prior art organic electroluminescent element has a problem in a low photo-outputting efficiency. This is because of the fact that a large number of transparent electrodes 11a/11b, 12a/12b and 13a and the transparent insulating layers 14a/14b weaken the emitted light.

SUMMARY OF THE INVENTION

It is therefore an important object of the present invention to provide an organic electroluminescent element for white light which allows a manufacturer to exactly regulate the tint of composite light.

To accomplish the object, the present invention proposes to inject electric charge from a boundary between luminescent layers.

In accordance with the present invention, there is provided an organic electroluminescent element comprising a multi-layer structure having a plurality of thin films which form a plurality of boundaries therebetween, and a plurality of electrodes, the plurality of thin films include a first organic luminescent layer for emitting light in a first color, a second organic luminescent layer for emitting light in a second color different from the first color, a third organic luminescent layer for emitting light in a third color different from the first and second colors, the plurality of electrodes are selectively connected to a first source of power voltage and a second source of power voltage different in potential level from the first source of power voltage for applying potentials to the first, second and third organic luminescent layers, and the plurality of electrodes include at least one electrode provided at one of the plurality of boundaries for injecting first electric charges into two of the first, second and third organic luminescent layers and other electrodes injecting second electric charges opposite in polarity to the first electric charges into the two of the first, second and third organic luminescent layers.

BRIEF DESCRIPTION OF THE DRAWINGS

The features and advantages of the organic electroluminescent element according to the present invention will be more clearly understood from the following description taken in conjunction with the accompanying drawings in which.

DESCRIPTION OF THE PREFERRED EMBODIMENTS

First Embodiment

Figure 3:
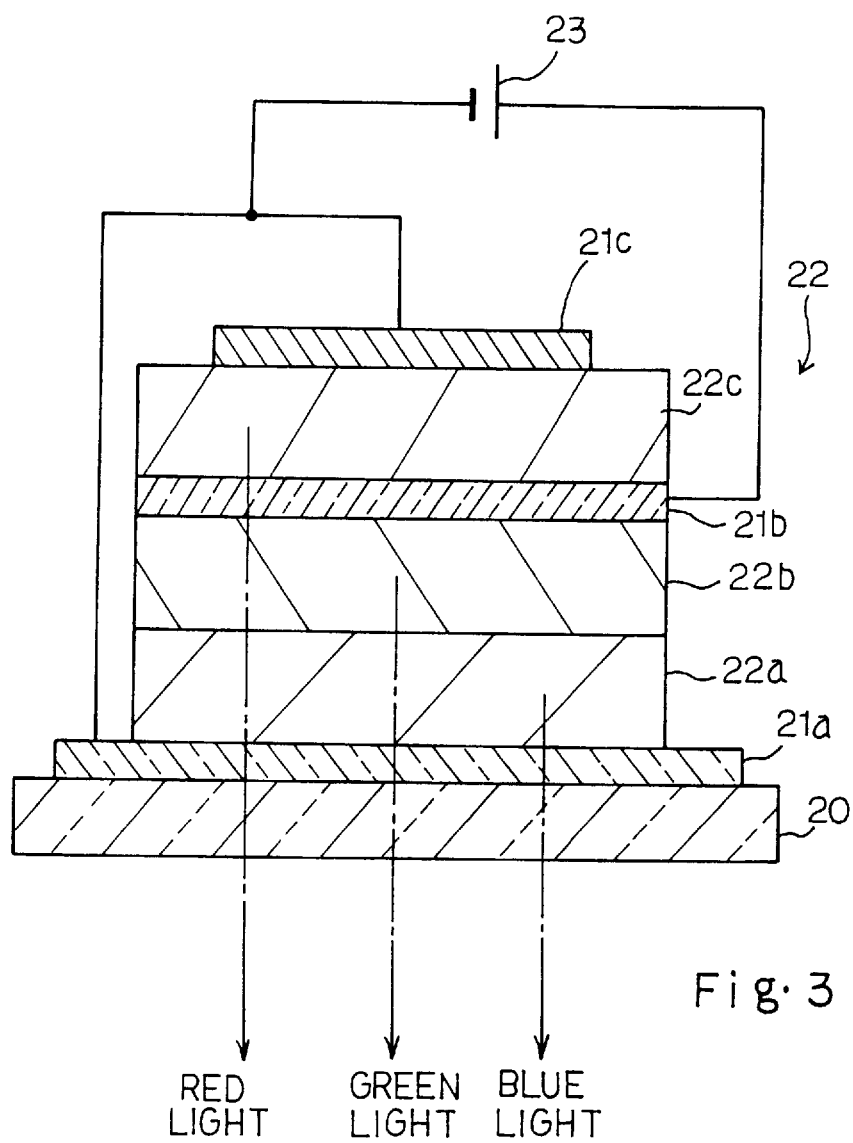
FIG. 3 a cross sectional view showing the structure of an organic electroluminescent element according to the present invention.

Referring to FIG. 3 of the drawings, an organic electroluminescent element embodying the present invention is fabricated on a substrate 20. A semi-transparent cathode 21a is formed on the substrate 20. On the semi-transparent cathode 21a are laminated luminescent layers 22a and 22b which are formed of organic compound for emitting light in blue and other organic compound for emitting light in green. A semi-transparent anode 21b is formed on the luminescent layer 22b, and is overlaid by a luminescent layer 22c. A cathode 21c is formed on the luminescent layer 22c, and may be non-transparent. The luminescent layer 22c is formed of organic compound for emitting light in red. The luminescent layers 22a, 22b and 22c as a whole constitute a multi-layer structure 22. In this instance, the semi-transparent anode 21b serves as at least one electrode.

An electric power source 23 is connected to the organic electroluminescent element. The positive terminal of the electric power source 23 is connected to the semi-transparent anode 21b, and the cathodes 21a and 21c are connected to the negative terminal of the electric power source 23. Holes are injected from the semi-transparent anode 21b into the luminescent layers 22c and 22b, and electrons are injected from the cathodes 21a and 21c into the luminescent layers 22a and 22c, respectively.

It is recommendable to use material having a small work function for the cathodes 21a/21c, and examples are indium, aluminum, magnesium, magnesium-indium alloy, magnesium-aluminum alloy, aluminum-lithium alloy and aluminum-scandium-lithium alloy. Indium-tin-oxide and silicon dioxide are semi-transparent, and are recommendable for the semi-transparent cathode 21a.

Subsequently, description is made on fabrication technologies for the organic electroluminescent element. The luminescent layers 22a to 22c are formed by using a vacuum evaporation, a molecular beam epitaxy or a coating technique such as, for example, a dipping, spin coating, a casting, a bar-coating or a roll-coating.

Any organic luminescent compound is available for the luminescent layers 22a to 22c. Typical examples of the organic luminescent compounds for the blue light are disclosed in U.S. Pat. Nos. 5,141,671 and 5,294,870, and are metallic complexes of 8-quinolinol and its derivatives, the metallic complexes doped with derivatives of perylene and coumarin.

Japanese Patent Publication of Unexamined Application No. 6-9953 discloses other organic luminescent compounds available for the luminescent layers 22a to 22c. The Japanese Patent Publication of Unexamined Application teaches that a derivative of distyryl-allylene and the derivative of distyryl-allylene doped with fluorescent dyestuff are desirable for the luminescent layer 22a for the blue light. Typical examples of luminescent material for the green light are tris(8-quinolinol)aluminum, a derivative of quinacridone, xanthene dyestuff and a derivative of coumarin. Typical examples of luminescent material for the red light are azine dyestuff, a derivative of coumarin, xanthene dyestuff, merocyanine dyestuff, acridine dyestuff and phthalocyanine dyestuff.

The semi-transparent anode 21b causes the potential across the luminescent layers 22a/22b to be close to the potential across the luminescent layer 22c, and, for this reason, the manufacturer exactly independently regulates the luminances of the emitted lights as will be described hereinafter.

The cathode 21c is formed of a material smaller in work function than the material for the semi-transparent cathode 21a. The smaller the work function, the more the cathode injects the electrons. For this reason, the cathode 21c is larger in injection efficiency than the semi-transparent cathode 21a. The organic luminescent compound for the red light is usually smaller in luminous efficiency than the other organic luminescent compounds for the blue light and the green light, and the difference in injection efficiency between the cathode 21c and the semi-transparent cathode 21a compensates the difference in luminous efficiency between the organic luminescent compound for the red light and the organic luminescent compounds for the blue and green lights.

Thus, the manufacturer can regulate the tint of the composite lights or the luminances of the emitted lights by not only changing the amount of fluorescent dye but also selecting the materials for the cathodes 21a/21c, and the potential evenly applied to the luminescent layers 22a to 22c makes the regulation easy.

Moreover, the fluorescent dyes are respectively mixed into the organic luminescent compounds, and the trapping level is decreased. This results in a small driving potential between the semi-transparent anode 21b and the cathodes 21a/21c.

Finally, the semi-transparent anode at the boundary between the luminescent layers 22b and 22c decreases the number of semi-transparent electrodes between the luminescent layer 22c and the substrate 20, and the organic electroluminescent element according to the invention is improved in the photo-outputting efficiency.

The organic electroluminescent element behaves under an appropriate biasing condition as follows. The semi-transparent anode injects holes into the luminescent layers 22b and 22c, and the cathodes 21a and 21c inject electrons into the luminescent layers 22a and 22c, respectively.

The electrons are moved in the electric field created across the luminescent layer 22c, and are recombined with the holes injected from the semi-transparent anode 21b. Then, recombination in the luminescent layer 22c results in the red light, and is emitted through the substrate 20. On the other hand, the electrons injected from the semi-transparent cathode 21a are moved in the electric field across the luminescent layers 22a and 22b, and are recombined with the holes injected into the luminescent layers 22b. The recombination in the luminescent layers 22b and 22a results in green light and blue light.

Second Embodiment

Figure 4:
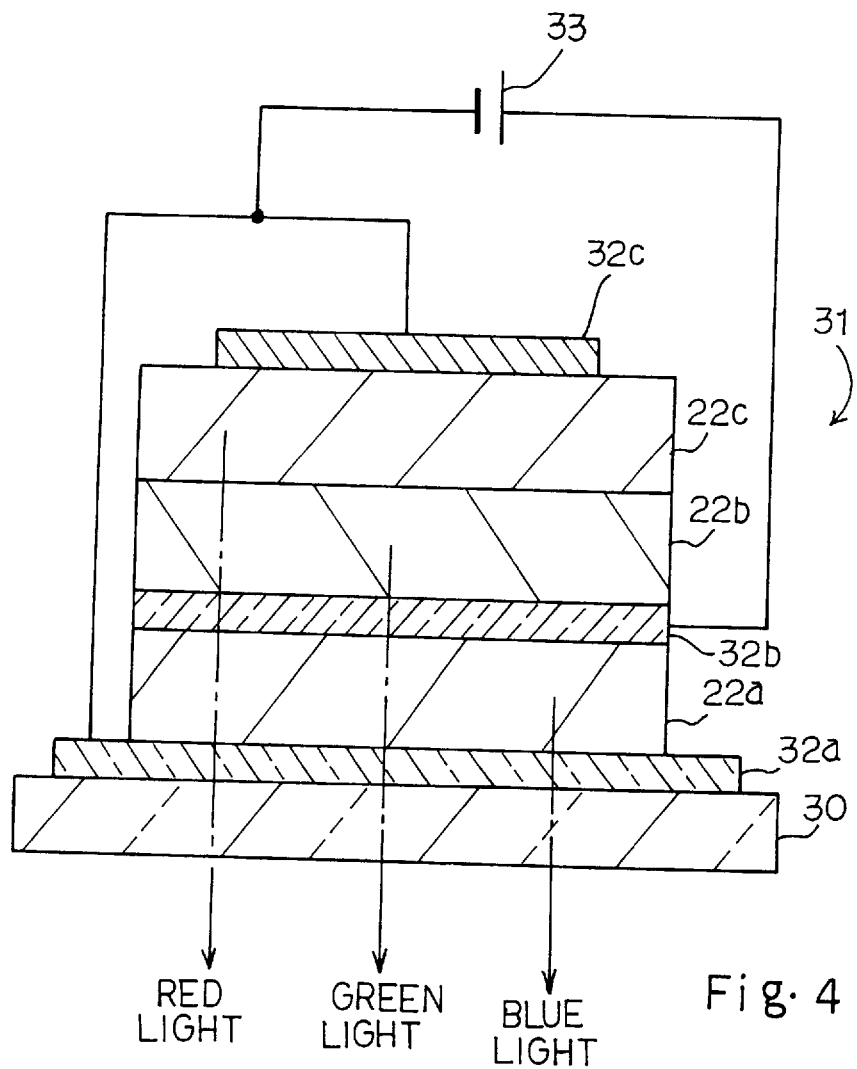
FIG. 4 is a cross sectional view showing the structure of another organic electroluminescent element according to the present invention.

Turning to FIG. 4 of the drawings, another organic electroluminescent element embodying the present invention is fabricated on a substrate 30. The organic electroluminescent element also comprises a multi-layer structure and a plurality of electrodes 32a/32b/32c. The luminescent layers 22a, 22b and 22c form in combination the multi-layer structure 31, and are labeled with the same references without detailed description.

The electrode 32b serves as a semi-transparent anode connected to the positive terminal of an electric power source 33, and is inserted between the luminescent layer 22a for the blue light and the luminescent layer 22b for the green light. The electrodes 32a and 32c are a semi-transparent cathode and a non-transparent cathode connected to the negative terminal of the electric power source 33, and the semi-transparent cathode 32a and the non-transparent cathode 32c are corresponding to those 21a and 21c of the first embodiment, respectively. In this instance, the semi-transparent anode 32b serves as at least one electrode.

The semi-transparent anode 32b injects holes into the luminescent layers 22a/22b, and the semi-transparent cathode 32a and the cathode 32c inject electrons into the luminescent layers 22a/22c. The materials for the cathodes 32a/32c are selected in such a manner that the material for the cathode 32c is smaller in work function than the material for the semi-transparent cathode 32a.

The organic electroluminescent element behaves as similar to the first embodiment, and the above described fabrication technologies are also applied to the organic electroluminescent element shown in FIG. 4.

The organic electroluminescent element implementing the second embodiment achieves all the advantages of the first embodiment.

Third Embodiment

Figure 5:
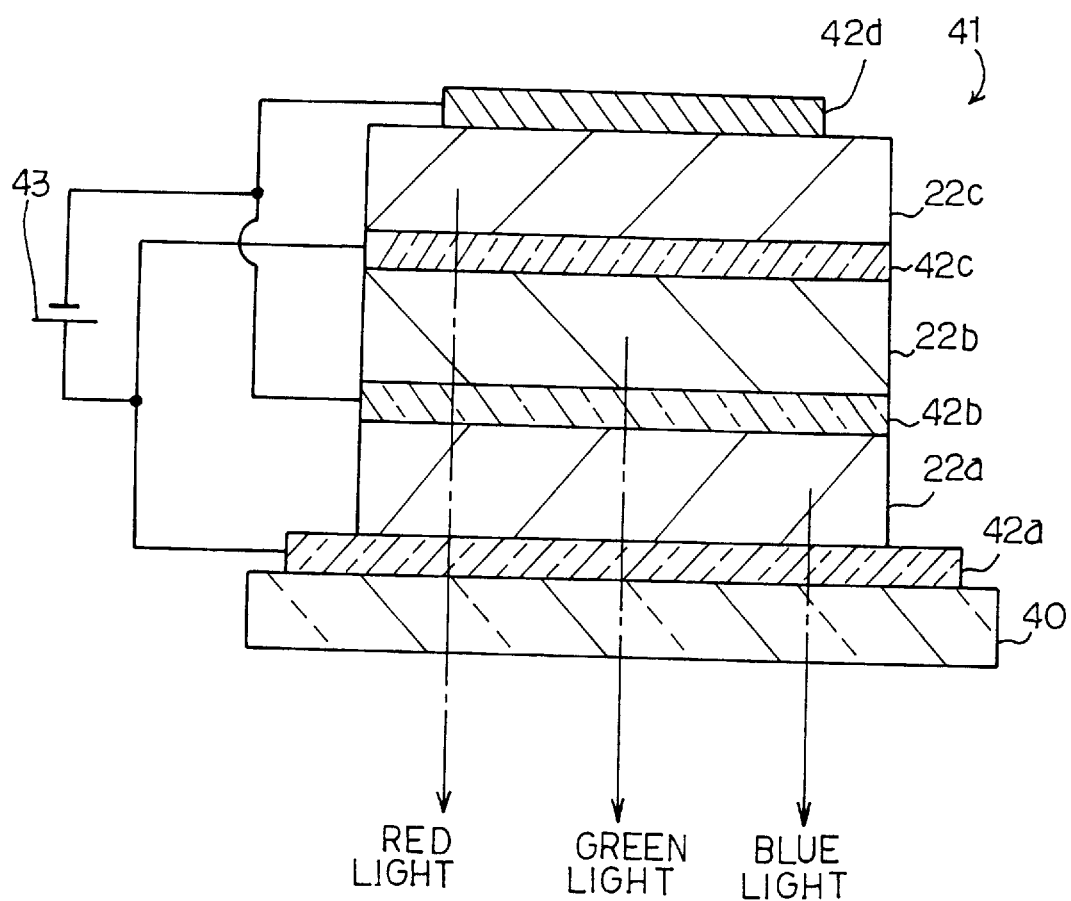
FIG. 5 is a cross sectional view showing the structure of yet another organic electroluminescent element according to the present invention.

Turning to FIG. 5 of the drawings, yet another organic electroluminescent element embodying the present invention is fabricated on a substrate 40. The organic electroluminescent element also comprises a multi-layer structure 41 and a plurality of electrodes 42*a*/42*b*/42*c*/42*d*. The luminescent layers 22*a*, 22*b* and 22*c* form in combination the multi-layer structure 41, and are labeled with the same references without detailed description.

The electrodes 42*a* and 42*c* serve as semi-transparent anodes, and are connected to the positive terminal of an electric power supply 43. On the other hand, the electrodes 42*b* and 42*d* serve as a semi-transparent cathode and non-transparent cathode, and are connected to the negative terminal of the electric power supply 43. The material for the cathode 42*d* is smaller in work function than the material for the semi-transparent cathode 42*a* so as to enhance the electron injecting efficiency to the luminescent layer 22*c* for the red light. In this instance, the semi-transparent anode 42*c* or the semi-transparent cathode 42*b* serves as at least one electrode.

When the organic electroluminescent element shown in FIG. 5 is appropriately biased, the semi-transparent anodes 42*a* and 42*c* inject holes into the luminescent layer 22*a* and the luminescent layers 22*b*/22*c*, respectively, and the cathodes 42*b* and 42*d* inject electrons into the luminescent layers 22*a*/22*b* and the luminescent layer 22*c*, respectively. The holes injected from the anode 42*a* are moved toward the semi-transparent cathode 42*b*, and are recombined with the electrodes injected therefrom. The recombination results in blue light. On the other hand, the holes injected from the anode 42*c* are moved toward the cathodes 42*b*/42*d*, and are recombined with the electrons injected therefrom. The recombination results in green light and red light. The blue light, the green light and the red light are emitted through the substrate 40.

The fabrication technologies are applicable to the organic electroluminescent element, and achieves all the advantages of the first embodiment.

Fourth Embodiment

Figure 6:
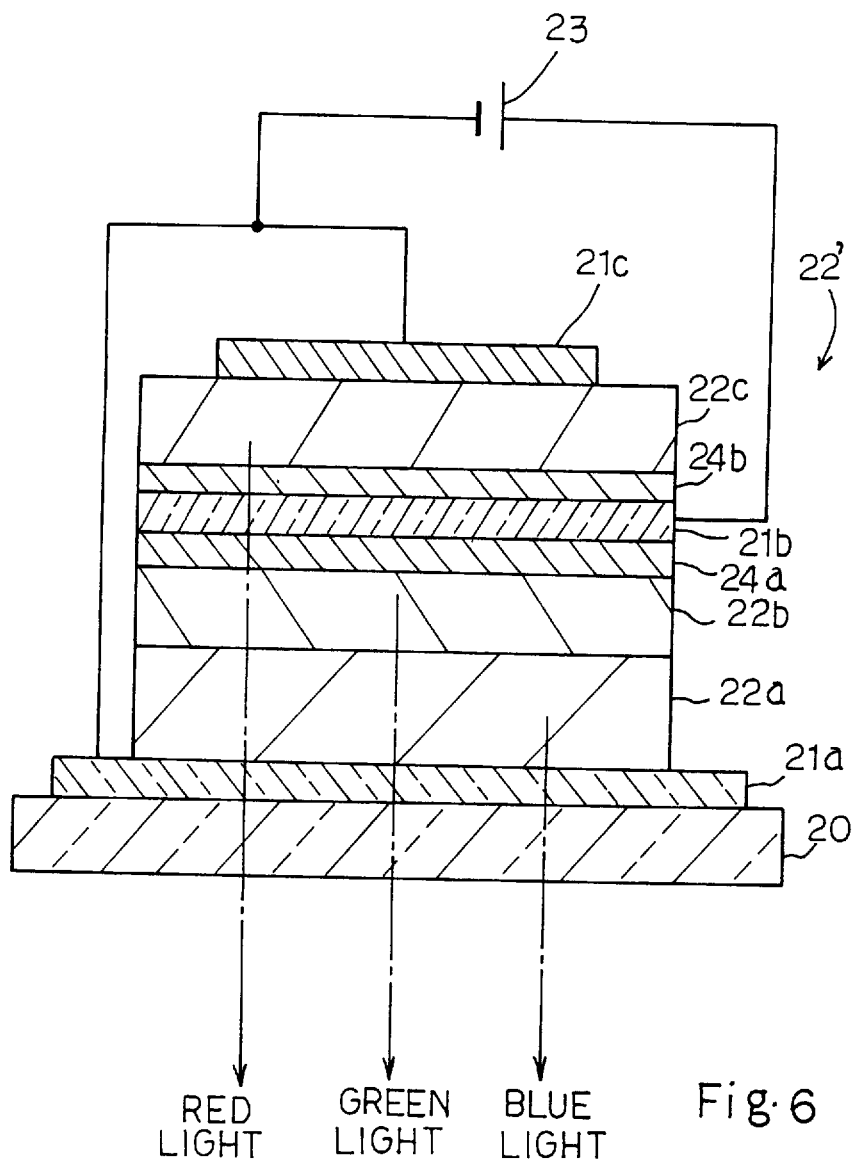
FIG. 6 is a cross sectional view showing the structure of still another organic electroluminescent element according to the present invention.

FIG. 6 illustrates an organic electroluminescent element embodying the present invention, and is similar to the first embodiment except for hole transporting layers 24*a* and 24*b*. For this reason, luminescent layers and electrodes of the organic electroluminescent element shown in FIG. 6 are labeled with the same references used for the luminescent layers and the electrodes of the first embodiment without detailed description.

The hole transporting layers 24*a* and 24*b* are provided between the semi-transparent anode 21*b* and the luminescent layers 22*b*/22*c*, and are, by way of example, formed of a derivative of triphenyl-diamine, a derivative of oxadiazole, a derivative of porphyrin, a derivative of stilbene or a derivative of allylamine. In this instance, the luminescent layers 22*a* to 22*c* and the hole transporting layers 24*a*/24*b* as a whole constitute a multi-layer structure 22'.

The semi-transparent anode 21*b* injects holes into the hole transporting layers 24*a* and 24*b*, and is expected to have the work function equal to or greater than 4.0 volts. The semi-transparent materials available for the anode 21*b* are indium-tin-oxide (ITO), tin oxide ($SnO_2$) and compound containing gold, silver or copper.

The fourth embodiment achieves all the advantages of the first embodiment.

Fifth Embodiment

Figure 7:
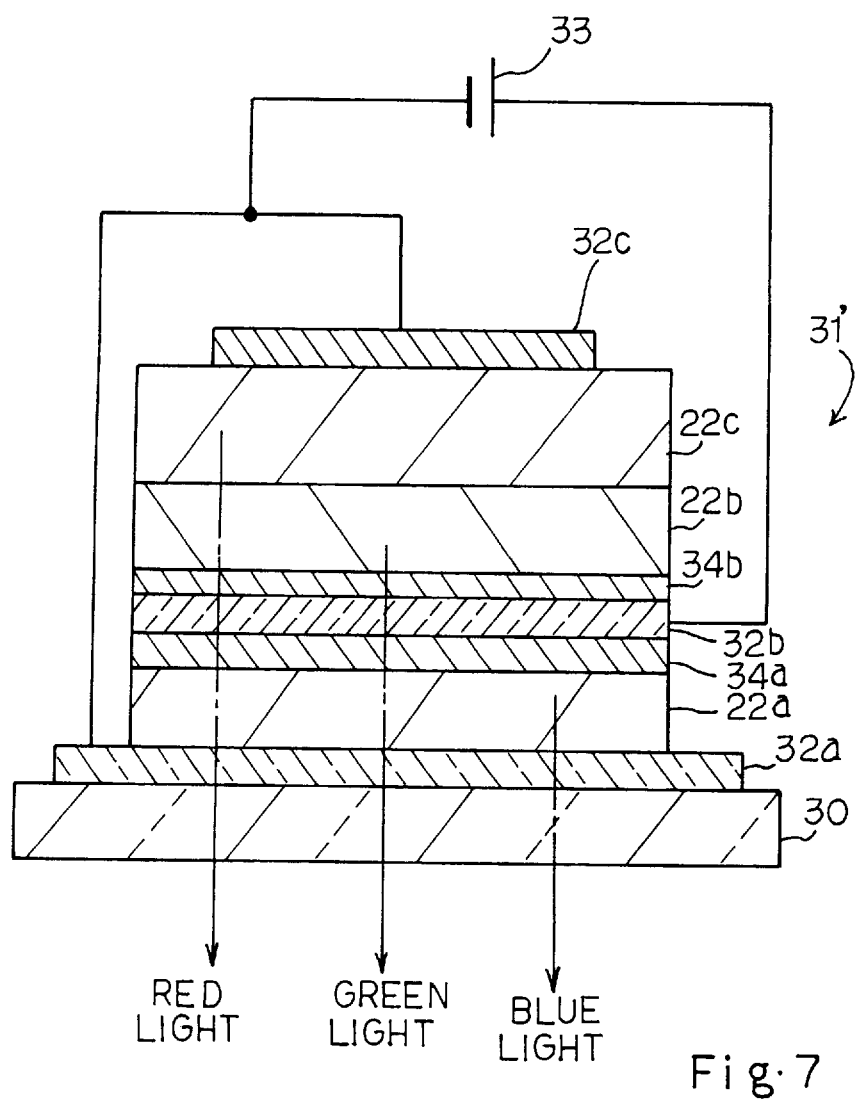
FIG. 7 is a cross sectional view showing the structure of still another organic electroluminescent element according to the present invention.

FIG. 7 illustrates an organic electroluminescent element embodying the present invention, and is similar to the second embodiment except for hole transporting layers 34*a* and 34*b*. For this reason, luminescent layers and electrodes of the organic electroluminescent element shown in FIG. 7 are labeled with the same references used for the luminescent layers and the electrodes of the second embodiment without detailed description.

The hole transporting layers 34*a* and 34*b* are inserted between the semi-transparent anode 32*b* and the luminescent layers 22*a* and 22*b*, and also formed of a derivative of triphenyl-diamine, a derivative of oxadiazole, a derivative of porphyrin, a derivative of stilbene or a derivative of allylamine, by way of example. In this instance, the luminescent layers 22*a* to 22*c* and the hole transporting layers 34*a*/34*b* as a whole constitute a multi-layer structure 31'.

The fifth embodiment achieves all the advantages of the second embodiment.

Sixth Embodiment

Figure 8:
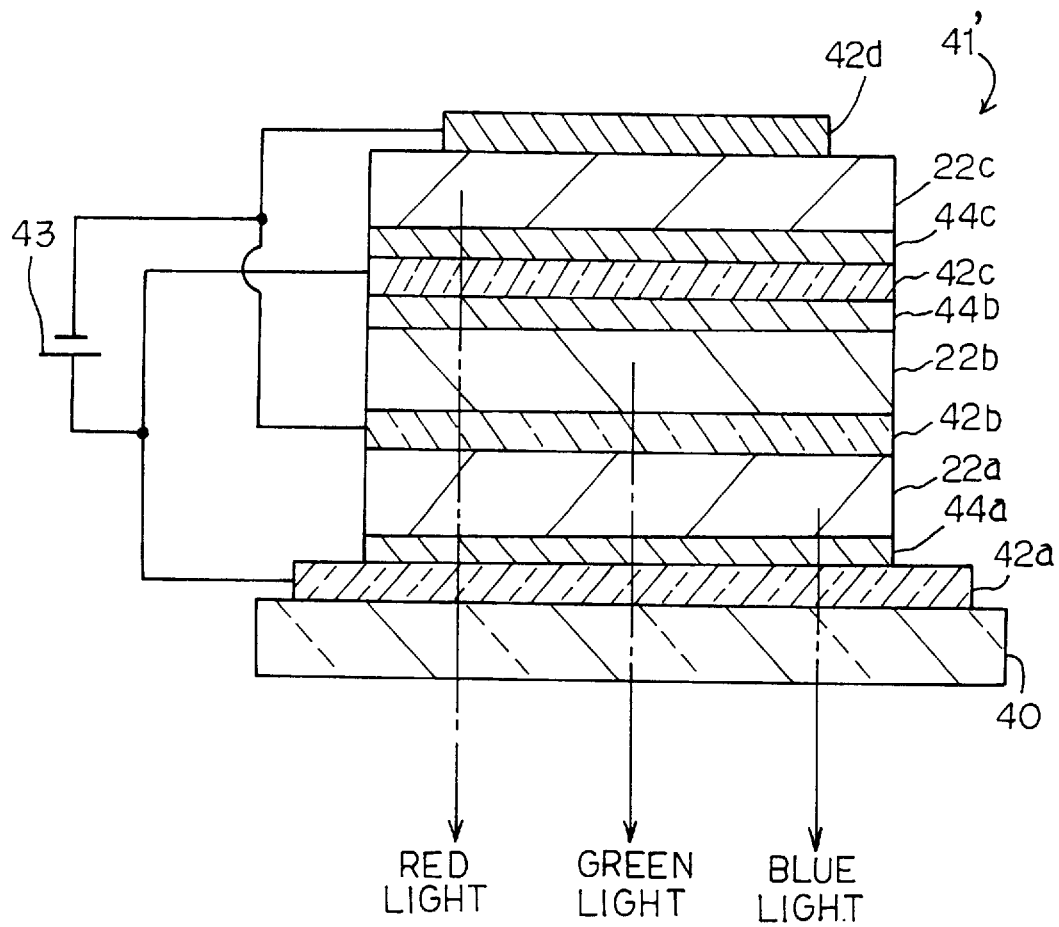
FIG. 8 is a cross sectional view showing the structure of still another organic electroluminescent element according to the present invention.

FIG. 8 illustrates an organic electroluminescent element embodying the present invention, and is similar to the third embodiment except for hole transporting layers 44*a*, 44*b* and 44*c*. For this reason, luminescent layers and electrodes of the organic electroluminescent element shown in FIG. 8 are labeled with the same references used for the luminescent layers and the electrodes of the third embodiment without detailed description.

The hole transporting layers 44*a* to 44*c* are inserted between the anodes 42*a*/42*c* and the luminescent layers 22*a*/22*b*/22*c*, and are also formed of the organic compound described in connection with the fourth embodiment. In this instance, the luminescent layers 22*a* to 22*c* and the hole transporting layers 44*a*/44*b*/44*c* as a whole constitute a multi-layer structure 41'. The sixth embodiment achieves all the advantages of the third embodiment.

Seventh Embodiment

Figure 9:
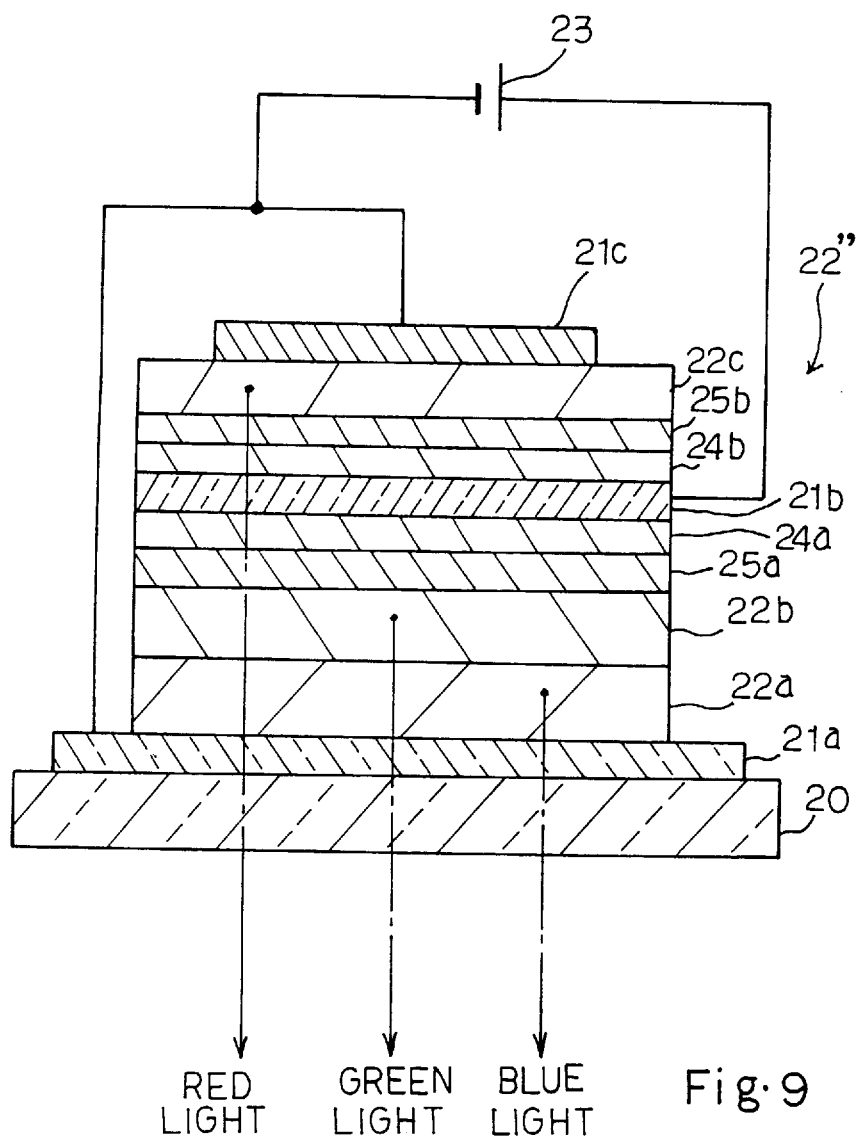
FIG. 9 is a cross sectional view showing the structure of still another organic electroluminescent element according to the present invention.

FIG. 9 illustrates an organic electroluminescent element embodying the present invention, and is similar to the fourth embodiment except for blocking layers 25*a* and 25*b*. For this reason, luminescent layers, electrodes and hole transporting layers of the organic electroluminescent element shown in FIG. 9 are labeled with the same references designating the luminescent layers, the electrodes and the hole transporting layers of the fourth embodiment without detailed description.

The blocking layers 25*a* and 25*b* are provided between the hole transporting layers 24*a*/24*b* and the luminescent layers 22*b*/22*c*, and confine exciton and electrons injected from the cathodes 21*a*/21*c* into the luminescent layers 22*a*/22*b* and 22*c*. Organic compound for the blocking layers 25*a* and 25*b* is expected not to seriously impede the injection of holes, and is larger in excitation energy than the organic compounds for the luminescent layers 22*a* to 22*c*. The derivative of triphenyl-diamine, the derivative of oxadiazole, a derivative of hydrazone, a derivative of butadiene, a derivative of styryl, a derivative of pyrazoline and a derivative of benzidine are available for the blocking layers 25*a*/25*b* in so far as the derivatives do not seriously lowers the luminous efficiency. In this instance, the luminescent layers 22*a* to 22*c*, the hole transporting layers 24*a*/24*b* and the blocking layers 25*a*/25*b* as a whole constitute a multi-layer structure 22".

The seventh embodiment achieves all the advantages of the fourth embodiment, and is improved in luminous efficiency.

Eighth Embodiment

Figure 10:
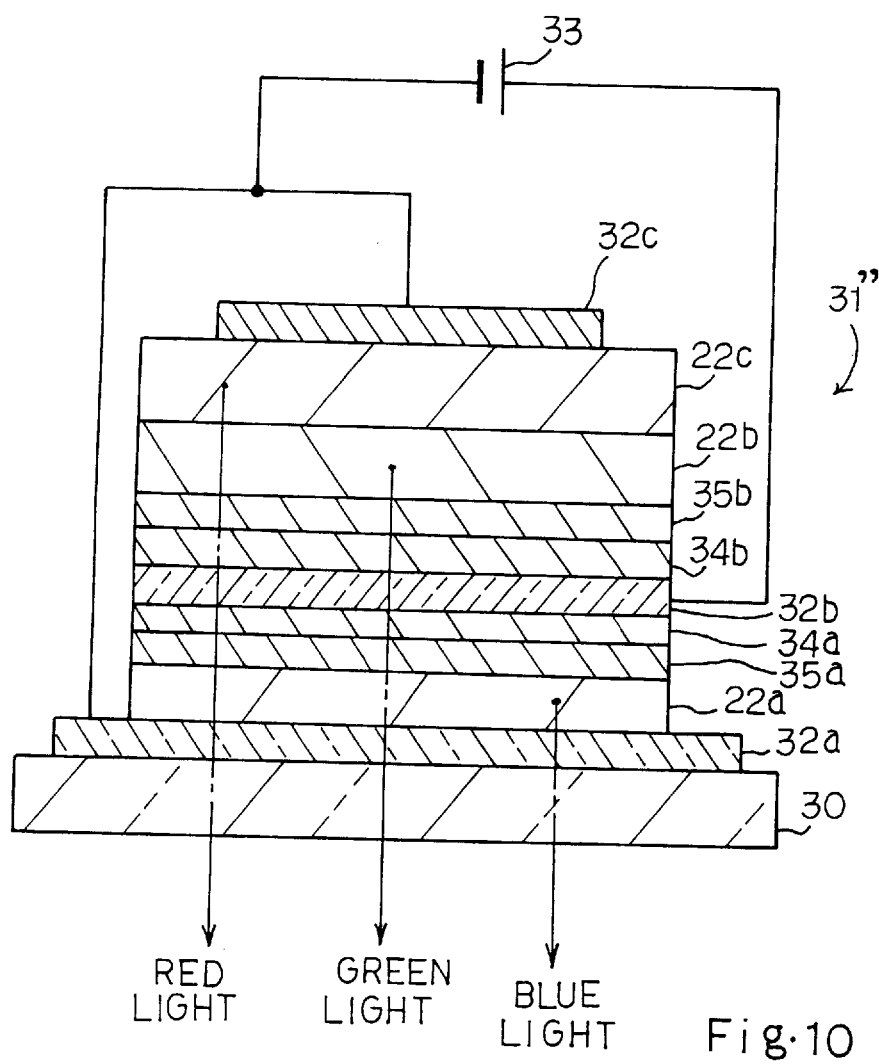
FIG. 10 is a cross sectional view showing the structure of still another organic electroluminescent element according to the present invention.

FIG. 10 illustrates an organic electroluminescent element embodying the present invention, and is similar to the fifth embodiment except for blocking layers 35*a* and 35*b*. For this reason, luminescent layers, electrodes and hole transporting layers of the organic electroluminescent element shown in FIG. 10 are labeled with the same references used for the luminescent layers, the electrodes and the hole transporting layers of the fifth embodiment without detailed description.

The blocking layers 35a and 35b are inserted between the hole transporting layers 34a/34b and the luminescent layers 22a and 22b. The blocking layers 35a/35b are similar to those of the seventh embodiment, and improves the luminous efficiency. In this instance, the luminescent layers 22a to 22c, the hole transporting layers 34a/34b and the blocking layers 35a/35b as a whole constitute a multilayer structure 31".

Ninth Embodiment

Figure 11:
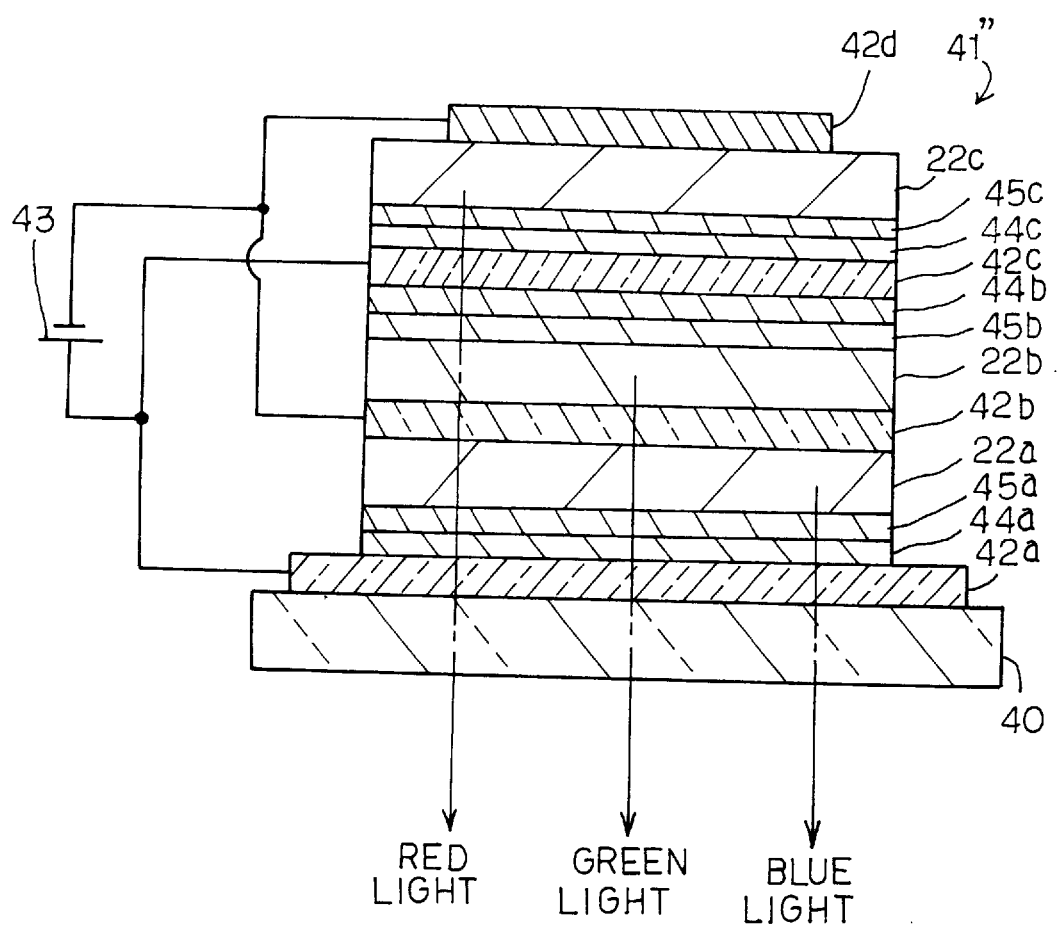
FIG. 11 is a cross sectional view showing the structure of still another organic electroluminescent element according to the present invention.

FIG. 11 illustrates an organic electroluminescent element embodying the present invention, and is similar to the sixth embodiment except for blocking layers 45a, 45b and 45c. For this reason, luminescent layers and electrodes of the organic electroluminescent element shown in FIG. 11 are labeled with the same references used for the luminescent layers, the electrodes and the hole transporting layers of the sixth embodiment without detailed description.

The blocking layers 45a to 45c are inserted between the hole transporting layers 44a to 44c and the luminescent layers 22a/22b/22c. The blocking layers 45a to 45c behave as similar to those of the seventh embodiment, and are also formed of the organic compound described hereinbefore. The luminescent layers 22a to 22c, the hole transporting layers 44a to 44c and the blocking layers 45a to 45c as a whole constitute a multi-layer structure 41". The blocking layers 45a to 45c improves the luminous efficiency of the organic electroluminescent element implementing the ninth embodiment, and the ninth embodiment achieves all the advantages of the third embodiment.

Tenth Embodiment

Figure 12:
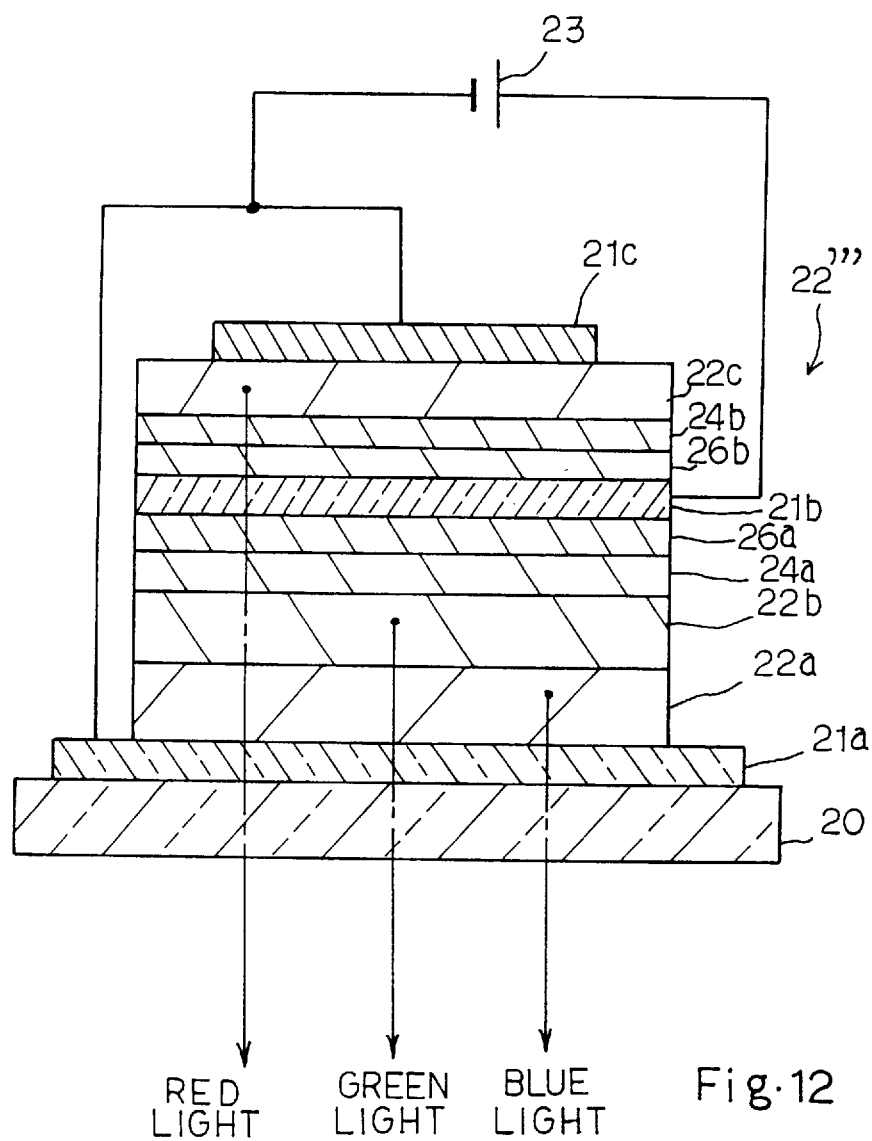
FIG. 12 is a cross sectional view showing the structure of still another organic electroluminescent element according to the present invention.

FIG. 12 illustrates an organic electroluminescent element embodying the present invention, and is similar to the fourth embodiment except for hole injecting layers 26a and 26b. For this reason, luminescent layers, electrodes and hole transporting layers of the organic electroluminescent element shown in FIG. 12 are labeled with the same references designating the luminescent layers, the electrodes and the hole transporting layers of the fourth embodiment without detailed description.

The hole injecting layers 26a and 26b are provided between the semi-transparent anode 21b and the hole transporting layers 24a/24b, and not only stably inject holes into the hole transporting layers 24a/24b but also enhance the adhesion to the semi-transparent anode 21b as taught in Applied Physics, vol. 64, No. 12, pages 1230 to 1233. Dyestuff in the condensed ring system are available for the hole injecting layers 26a and 26b, and examples of 0the dyestuff are spiro-compound, azo-compound, quinone-compound, indigo-compound, diphenylmethan-compound, quinacridone-compound, polymethine-compound, acridine compound and porphyrine compound as taught by Okawara et. al. in "Dyestuff Handbook". Moreover, low-molecular organic p-type semiconductors such as, for example, aromatic amine are available for the hole injecting layers 26a/26b as disclosed in Organic Semiconductors, VERLAG CHEMIE '74.

In this instance, the luminescent layers 22a to 22c, the hole transporting layers 24a/24b and the hole injecting layers 26a/26b as a whole constitute a multi-layer structure 22'".

Eleventh Embodiment

Figure 13:
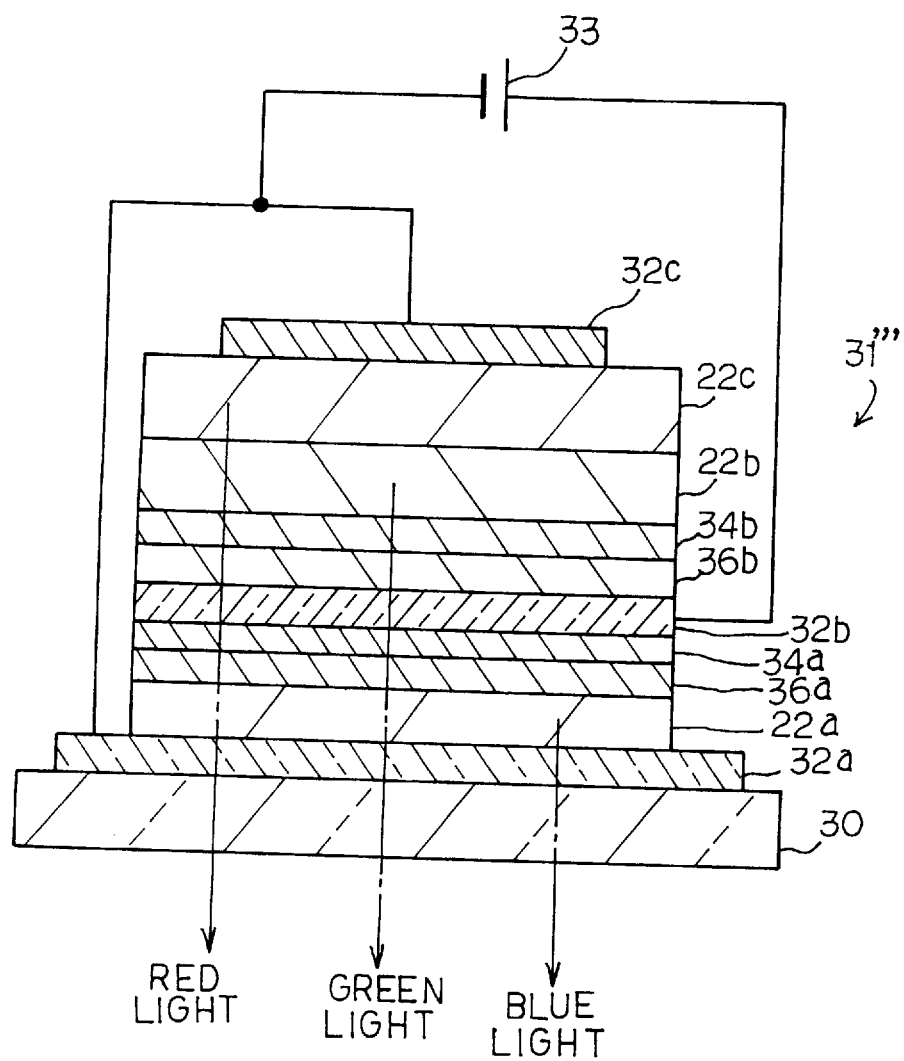
FIG. 13 is a cross sectional view showing the structure of still another organic electroluminescent element according to the present invention.

FIG. 13 illustrates an organic electroluminescent element embodying the present invention, and is similar to the fifth embodiment except for hole injecting layers 36a and 36b. For this reason, luminescent layers, electrodes and hole transporting layers of the organic electroluminescent element shown in FIG. 13 are labeled with the same references designating the luminescent layers, the electrodes and the hole transporting layers of the fifth embodiment without detailed description.

The hole injecting layers 36a and 36b are inserted between the semi-transparent anode 32b and the hole transporting layers 34a/34b. The hole injecting layers 36a/36b behave as similar to the hole injecting layers 26a/26b, and the condensed ring dyestuff and the low-molecular p-type organic semiconductors are available for the hole injecting layers 36a/36b. In this instance, the luminescent layers 22a to 22c, the hole transporting layers 34a/34b and the hole injecting layers 36a/36b as a whole constitute a multi-layer structure 31'".

Twelfth Embodiment

Figure 14:
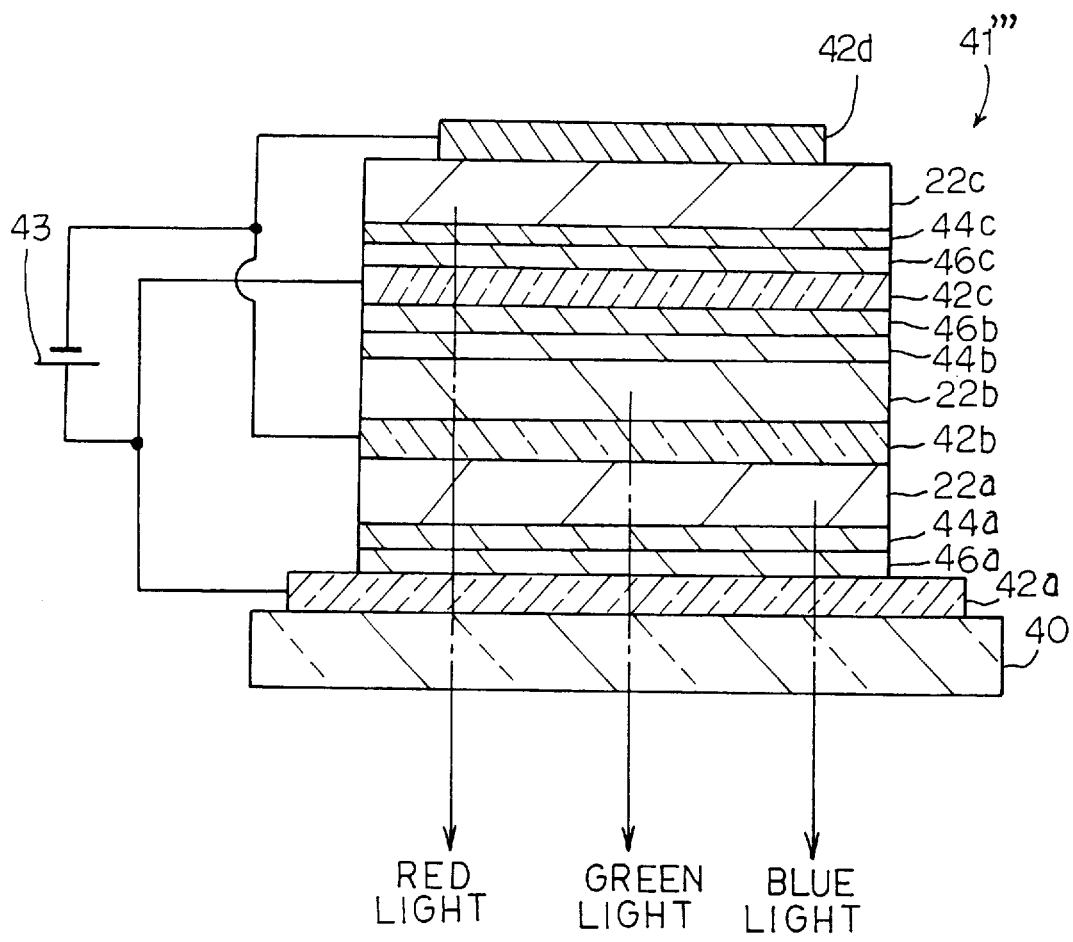
FIG. 14 is a cross sectional view showing the structure of still another organic electroluminescent element according to the present invention.

FIG. 14 illustrates an organic electroluminescent element embodying the present invention, and is similar to the sixth embodiment except for hole injecting layers 46a, 46b and 46c. For this reason, luminescent layers, electrodes and hole transporting layers of the organic electroluminescent element shown in FIG. 14 are labeled with the same references designating the luminescent layers, the electrodes and the hole transporting layers of the sixth embodiment without detailed description.

The hole injecting layers 46a to 46b are inserted between the semi-transparent anodes 42a/42c and the hole transporting layers 44a/44b/44c. The hole injecting layers 46a/46b/46c behave as similar to the hole injecting layers 26a/26b, and the condensed ring dyestuff and the low-molecular p-type organic semiconductors are also available for the hole injecting layers 46a/46b/46c. In this instance, the luminescent layers 22a to 22c, the hole transporting layers 34a to 34c and the hole injecting layers 46a to 46c as a whole constitute a multi-layer structure 41'".

Thirteenth Embodiment

Figure 15:
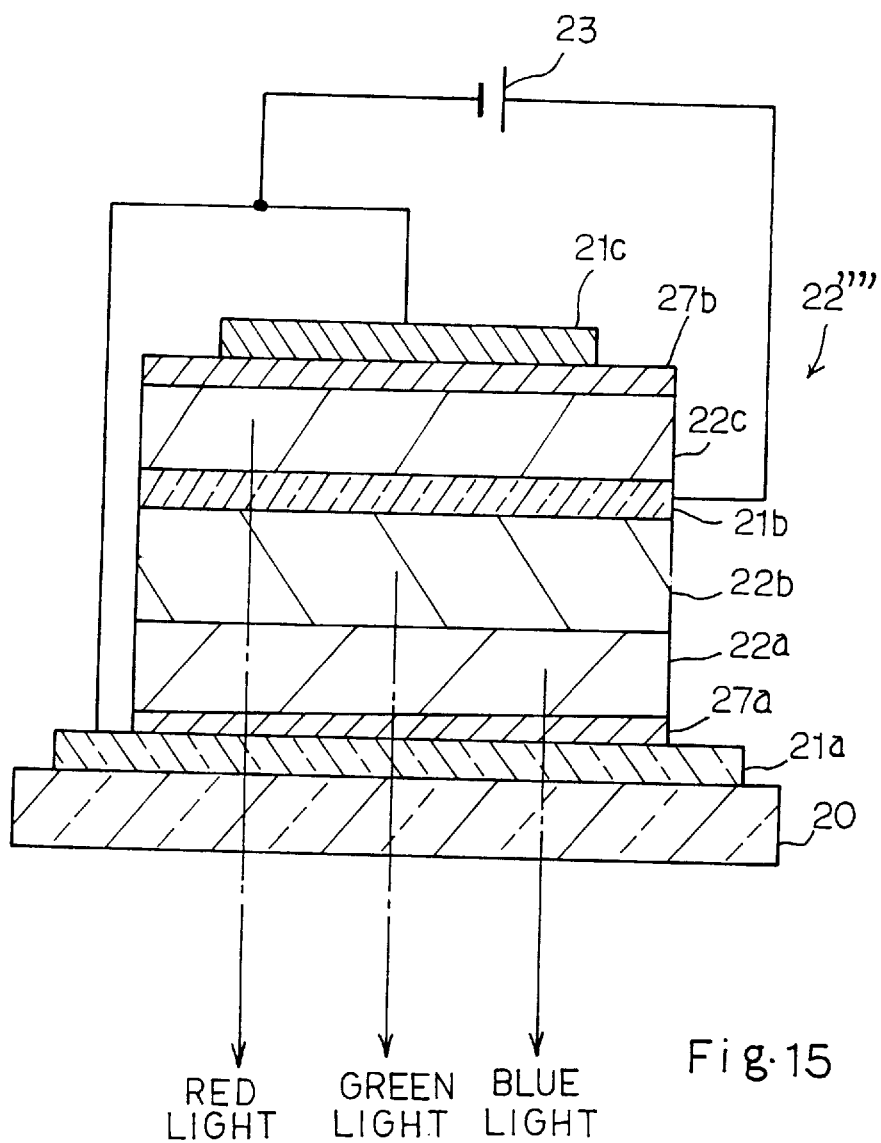
FIG. 15 is a cross sectional view showing the structure of still another organic electroluminescent element according to the present invention.

FIG. 15 illustrates an organic electroluminescent element embodying the present invention, and is similar to the first embodiment except for electron injecting/transporting layers 27a and 27b. For this reason, luminescent layers and electrodes of the organic electroluminescent element shown in FIG. 15 are labeled with the same references designating the luminescent layers and the electrodes of the first embodiment without detailed description.

The electron injecting/transporting layers 27a and 27b are provided between the cathodes 21a/21c and the luminescent layers 22a/22c, and range from 0.1 nanometer to 1.0 nanometer thick. The electron injecting/transporting layers 27a/27b are, by way of example, formed of 8-quinolinol, a derivative of 8-quinolinol, a derivative of oxadiazole, a derivative of diphenylquinone or oxide of alkaline earth metal such as, for example, SrO, CaO and BaO as taught by Japanese Patent Publication of Unexamined Application NO. 6-163158. The strontium oxide and the calcium oxide are semi-transparent, and are recommendable for the electron injecting/transporting layer 27a. In this instance, the luminescent layers 22a to 22c and the hole transporting layers 24a/24b as a whole constitute a multi-layer structure 22'.

Fourteenth Embodiment

Figure 16:
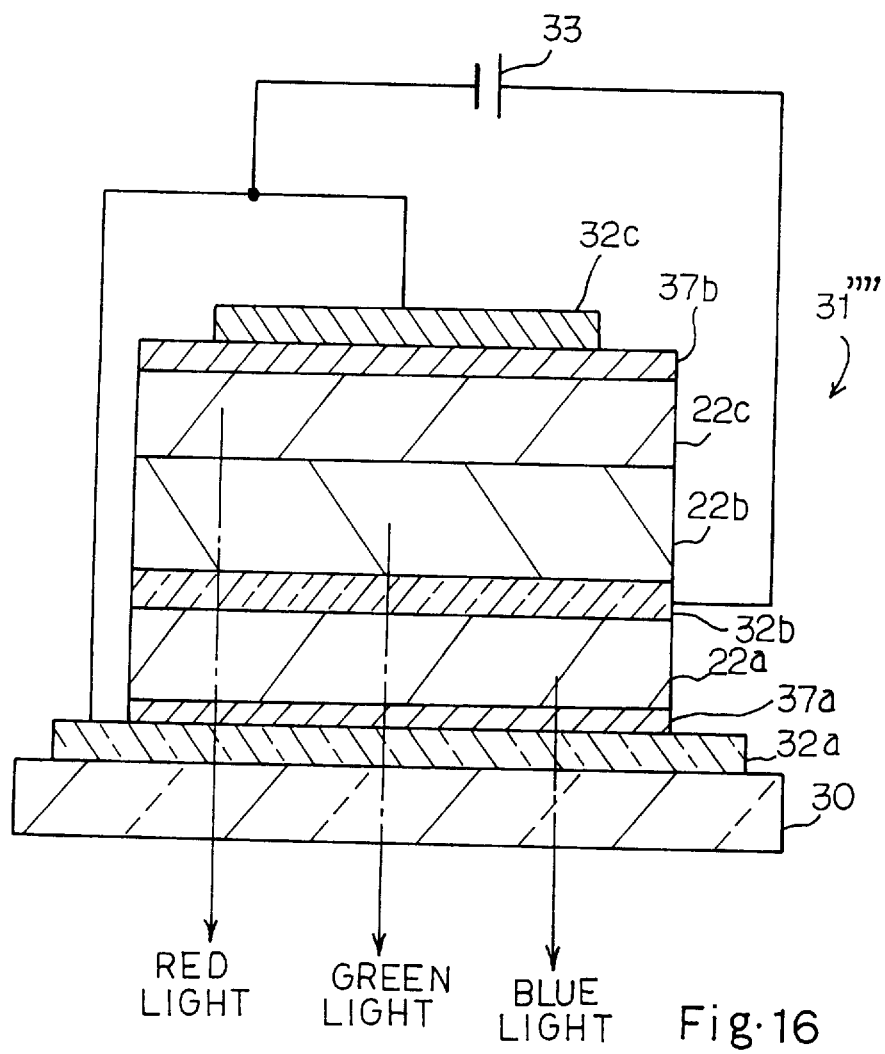
FIG. 16 is a cross sectional view showing the structure of still another organic electroluminescent element according to the present invention.

FIG. 16 illustrates an organic electroluminescent element embodying the present invention, and is similar to the second embodiment except for electron injecting/transporting layers 37a and 37b. For this reason, luminescent layers and electrodes of the organic electroluminescent element shown in FIG. 16 are labeled with the same references designating the luminescent layers and the electrodes of the second embodiment without detailed description.

The electron injecting/transporting layers 37a and 37b are provided between the cathodes 32a/32c and the luminescent layers 22a/22c, and formed of the same material as the electron injecting/transporting layers 27a/27b. The electron injecting/transporting layers 37a/37b behave as similar to the electron injecting/transporting layers 27a/27b. In this instance, the luminescent layers 22a to 22c and the electron injecting/transporting layers 37a/37b as a whole constitute a multi-layer structure 31"".

Fifteenth Embodiment

Subsequently, using a molecular beam epitaxy, tris aluminum, which is hereinbelow abbreviated as "Alq", was deposited to 18 nanometers thick on the electron injecting layer, and Alq layer served as an electron transporting layer.

Using the derivative of distyrylbiphenyl, which is expressed by chemical formula 1 and hereinbelow abbreviated as DPVBi, and the compound, which is expressed by chemical formula 1 and hereinbelow abbreviated as BczVBi, as a host material and a guest material, an organic luminescent layer for blue light was grown to 35 nanometers thick on the electron transporting layer in ultra high vacuum. The BczVBi was 3.1 mol % with respect to DPVBi. Thus, a luminescent medium for blue light was completed.

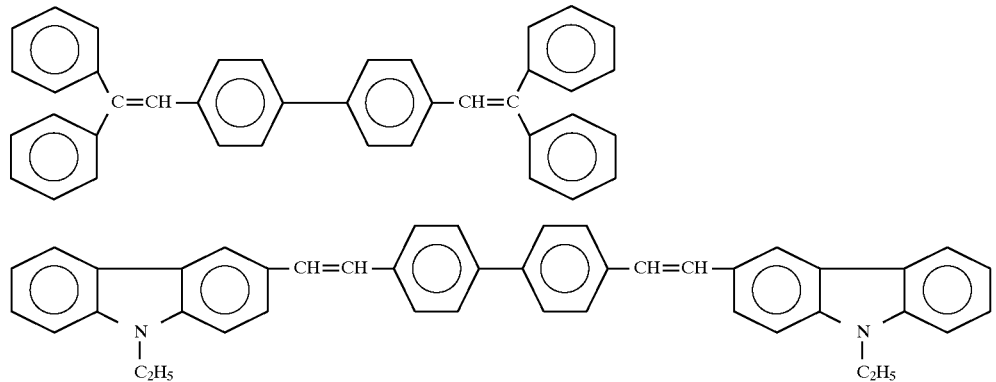

Figure 17:
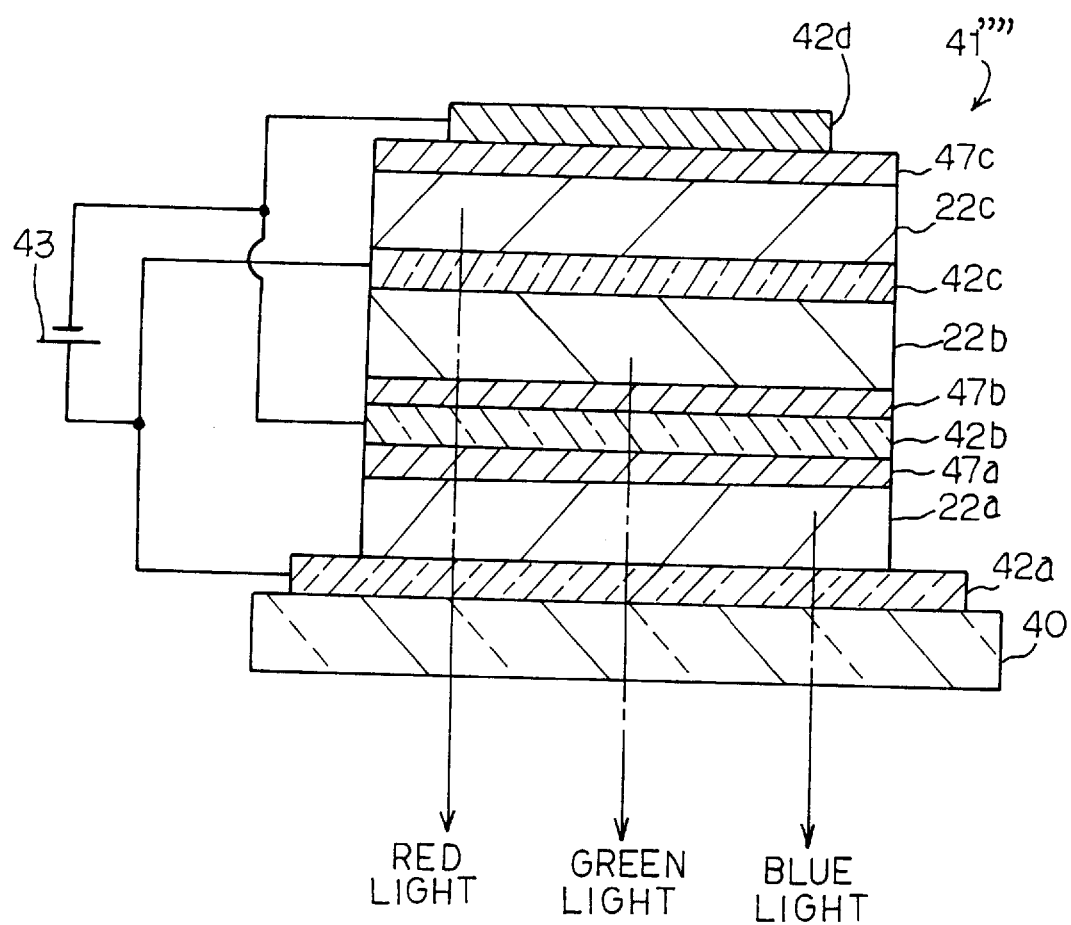
FIG. 17 is a cross sectional view showing the structure of still another organic electroluminescent element according to the present invention.

FIG. 17 illustrates an organic electroluminescent element embodying the present invention, and is similar to the third embodiment except for electron injecting/transporting layers 47a, 47b and 47c. For this reason, luminescent layers and electrodes of the organic electroluminescent element shown in FIG. 17 are labeled with the same references designating the luminescent layers and the electrodes of the third embodiment without detailed description.

The electron injecting/transporting layers 47a to 47c are provided between the cathodes 42b/42d and the luminescent layers 22a to 22c, and formed of the same material as the electron injecting/transporting layers 27a/27b. The electron injecting/transporting layers 37a/37b behave as similar to the electron injecting/transporting layers 27a/27b. In this instance, the luminescent layers 22a to 22c and the electron injecting/transporting layers 47a to 47c as a whole constitute a multi-layer structure 41"".

An organic electroluminescent element according to the present invention may have both of the hole transporting layer and the electron injecting/transporting layers. The luminescent layer forms a luminescent medium together with a layer or layers selected from the hole injecting layer, the hole transporting layers, the blocking layers, the electron injecting layer and the electron transporting layer.

The present inventor fabricated organic electroluminescent elements according to the present invention, and evaluated the organic electroluminescent elements as follows.

First Example

The arrangement of electrodes was similar to the first embodiment shown in FIG. 3. A glass substrate was firstly prepared, and was cleaned. A semi-transparent cathode of $SnO_2$ was formed on the glass substrate, and SrO was grown to 0.5 nanometers thick on the semi-transparent cathode. The strontium oxide served as an electron injecting layer.

Subsequently, Alq was grown to 35 nanometers thick on the luminescent medium in ultra high vacuum, and N, N'-biphenyl-N,N'-bis(α-naphthyl)-1,1'-biphenyl-4,4'-diamine, which was abbreviated as α-NPD, was grown to 30 nanometers thick on the Alq layer for providing a hole transporting layer. Thus, a luminescent medium for green light was formed in such a manner as to be held in contact with the luminescent medium for the blue light.

Subsequently, a semi-transparent anode of indium-zinc alloy was grown to 200 nanometers thick by using a low-temperature process, and β-NPD was grown to 40 nanometers thick in high vacuum for forming a hole transporting layer of a luminescent medium for red light. Using Alq and red fluorescent dyestuff of 4-dicyanomethylene-2-methyl-6-(p-dimethylaminostyryl-4H-pyran, which is hereinbelow abbreviated as DCM, as a host material and a guest material, an organic luminescent layer was grown to 50 nanometers thick, and DCM was 1.8 mol % with respect to Alq. Thus, the luminescent medium for red light was completed.

An aluminum alloy target containing scandium at 1 mol % was evaporated in argon gas by using an rf sputtering, and lithium was concurrently evaporated by using a resistance heating evaporation technique. As a result, a cathode of 20 nanometers thick was formed on the organic luminescent layer for the red light, and contained lithium at 0.3 mol %. Finally, aluminum alloy containing scandium at 1 mol % was deposited to 300 nanometers thick by using the rf sputtering in argon gas, and the cathode was covered with a protective layer.

A direct current source was connected between the semi-transparent anode and the semi-transparent cathode/the cathode. When the bias voltage was adjusted to 10 volts, the organic electroluminescent element achieved 4520 cd/m², and the emitted light at 100 cd/m² had the chromaticity at X=0.34 and Y=0.361 in the CIE chromaticity coordinates. The luminance was 3.6 times larger than the luminance of the first comparative sample described hereinlater, and the emitted light was white. The large luminance was derived from the improvement in carrier injection/transporting efficiency and the luminous quantum efficiency.

Second Example

The second example was similarly fabricated except for the followings. The electron transporting layer of Alq was 18 nanometers thick for the luminescent medium for blue light. DPVBi and BczVBi were dispersed in a binder of polyvinylcarbazole, which is hereinbelow abbreviated as PVK, and DPVBi and BczVBi were adjusted to the ratio of 100 :3 by mole. The mixture of DPVBi, BczVBi and PVK was spun onto the Alq layer for forming the organic luminescent layer for the blue light of 35 nanometers thick.

The second example was also connected to the direct current source, and the semi-transparent anode was biased at 10 volts with respect to the semi-transparent cathode and the cathode. The second example achieved 2860 $cd/m^2$ at 10 volts, and the emitted light at 100 $cd/m^2$ had the chromaticity at X=0.328 and Y=0.381 in the CIE chromaticity coordinates. The luminance was 2.9 times larger than the luminance of the second comparative sample described hereinlater.

Third Example

The arrangement of electrodes was similar to the second embodiment shown in FIG. 4. The present inventor firstly prepared a glass substrate, and the glass substrate was sufficiently cleaned. $SnO_2$ was deposited on the glass substrate, and formed a semi-transparent cathode. SrO was deposited to 0.5 nanometer thick on the semi-transparent cathode, and formed an electron injecting layer.

Subsequently, Alq was deposited to 20 nanometers thick on the electron injecting layer in ultra high vacuum by using the molecular beam epitaxy, and a host material of DPVBi and a guest material of BczVBi were formed into an organic luminescent layer of 45 nanometers thick for blue light in ultra high vacuum. The guest material was 3.1 mol % with respect to the host material. α-NPD was grown to 45 nanometers thick in high vacuum so as to form a hole transporting layer, and copperphthalocyanine, which is hereinbelow abbreviated as "CuPc", was deposited to 5 nanometers thick. Thus, an organic luminescent medium for blue light was completed.

Subsequently, a semi-transparent anode of indium-zinc alloy was deposited on the organic luminescent medium for blue light by using a low-temperature process, and α-NPD was deposited to 45 nanometers thick so as to laminate a hole transporting layer on the semi-transparent anode. Alq was deposited to 35 nanometers thick in ultra high vacuum so as to laminate an organic luminescent layer of an organic luminescent medium for green light on the hole transporting layer.

Subsequently, an organic luminescent layer of an organic luminescent medium for red light was deposited to 40 nanometers thick on the organic luminescent layer in high vacuum for green light. For the organic luminescent layer for red light, Alq and red fluorescent dyestuff of DCM were selected as the host material and the guest material, and DCM was adjusted to 1.8 mol % with respect to Alq. As a result, the organic luminescent medium for red light was provided in such a manner as to be held in contact with the organic luminescent medium for green light.

An aluminum alloy target containing scandium at 1 mol % was evaporated in argon gas by using an rf sputtering, and lithium was concurrently evaporated by using a resistance heating evaporation technique. As a result, a cathode of 20 nanometers thick was formed on the organic luminescent layer for the red light, and contained lithium at 0.3 mol %. Finally, aluminum alloy containing scandium at 1 mol % was deposited to 300 nanometers thick by using the RF sputtering in argon gas, and the cathode was covered with a protective layer.

The semi-transparent anode was connected to a positive terminal of a direct current source, and the cathode and the semi-transparent cathode were connected to a negative terminal of the direct current source. The third example achieved 4260 $cd/m^2$ at 10 volts, and the emitted light at 100 $cd/m^2$ had the chromaticity at X=0.355 and Y=0.378 in the CIE chromaticity coordinates. The luminance was 4 times larger than the luminance of the first comparative sample, and the emitted light was white.

Fourth Example

The fourth example was similar to the third example except for the followings. The electron transporting layer of Alq was deposited to 20 nanometers thick for the organic luminescent medium for blue light. DPVBi and BczVBi were dispersed in a binder of PVK, and DPVBi and BczVBi were adjusted to the ratio of 100:3 by mole. The mixture of DPVBi, BczVBi and PVK was spun onto the Alq layer for forming the organic luminescent layer for the blue light of 70 nanometers thick.

The fourth example was also connected to the direct current source, and the semi-transparent anode was biased at 10 volts with respect to the semi-transparent cathode and the cathode. The fourth example achieved 3060 $cd/m^2$ at 10 volts, and the emitted light at 100 $cd/m^2$ had the chromaticity at X=0.326 and Y=0.370 in the CIE chromaticity coordinates. The luminance was 3.2 times larger than the luminance of the second comparative sample, and the emitted light was substantially white.

Fifth Example

The arrangement of electrodes was similar to the third embodiment shown in FIG. 5. The present inventor cleaned a glass substrate, and indium-tin-oxide was deposited on the glass substrate for forming a semi-transparent anode.

CuPc was deposited to 5 nanometers thick so as to laminate a hole injecting layer on the semi-transparent anode, and α-NPD was deposited to 40 nanometers thick on the hole injecting layer. The α-NPD layer served as a hole transporting layer. The host material of DPVBi and the guest material of BczVBi were deposited to 45 nanometers thick in ultra high vacuum so as to form an organic luminescent layer for blue light, and the guest material was adjusted to 3.1 mol % with respect to the host material. Alq was deposited to 20 nanometers thick in the ultra high vacuum so as to form an electron transporting layer. Thus, an organic luminescent medium for blue light was completed.

On the organic luminescent medium for blue light was deposited SrO which formed a semi-transparent cathode of 0.5 nanometer thick. The semi-transparent cathode injected electron into the organic luminescent medium for blue light. A transparent electrode of indium-zinc alloy was laminated on the semi-transparent cathode, and was overlain by a semi-transparent cathode of SrO. The semi-transparent cathode injected electron into an organic luminescent medium for green light.

Alq was deposited to 50 nanometers thick so as to laminate a luminescent layer on the semi-transparent cathode, and was overlain by α-NPD of 50 nanometers thick. The α-NPD layer served as a hole transporting layer.

In this way, the organic luminescent medium for green light was completed.

Indium-zinc alloy was deposited so as to form a semi-transparent anode on the organic luminescent medium for green light, and α-NPD was deposited to 30 nanometers thick in high vacuum so as to laminate a hole transporting layer on the semi-transparent anode. An organic luminescent layer of 50 nanometers thick was formed from Alq serving as a host material and red fluorescent dyestuff of DCM serving as a guest material in high vacuum, and DCM was 1.8 mol % with respect to Alq. Thus, an organic luminescent medium for red light was completed.

An aluminum alloy target containing scandium at 1 mol % was evaporated in argon gas by using an rf sputtering, and lithium was concurrently evaporated by using a resistance heating evaporation technique. As a result, a cathode of 20 nanometers thick was formed on the organic luminescent medium for the red light, and contained lithium at 0.3 mol %. Finally, aluminum alloy containing scandium at 1 mol % was deposited to 300 nanometers thick by using the rf sputtering in argon gas, and the cathode was covered with a protective layer.

A direct current source was connected between the semi-transparent anodes and the semi-transparent cathode/the cathode. When the bias voltage was adjusted to 10 volts, the organic electroluminescent element achieved 4015 cd/m$^2$, and the emitted light at 100 cd/m$^2$ had the chromaticity at X=0.345 and Y=0.371 in the CIE chromaticity coordinates. The luminance was 4.7 times larger than the luminance of the third comparative sample described hereinlater, and the emitted light was white.

When the bias was removed from one of the organic luminescent media, the fifth example emitted light in different color from white.

Sixth Example

The sixth example was similar to the fifth example except for the followings. The electron transporting layer of Alq was deposited to 20 nanometers thick for the organic luminescent medium for blue light. DPVBi and BczVBi were dispersed in the binder of PVK, and DPVBi and BczVBi were adjusted to the ratio of 100:3 by mole. The mixture of DPVBi, BczVBi and PVK was spun onto the Alq layer for forming the organic luminescent layer for the blue light of 70 nanometers thick.

The sixth example was also connected to the direct current source, and the semi-transparent anodes were biased at 10 volts with respect to the semi-transparent cathode and the cathode. The sixth example achieved 3140 cd/m$^2$ at 10 volts, and the emitted light at 100 cd/m$^2$ had the chromaticity at X=0.344 and Y=0.369 in the CIE chromaticity coordinates. The luminance was 6 times larger than the luminance of the fourth comparative sample described hereinlater in detail, and the emitted light was white.

First Comparative Sample

Figure 1:
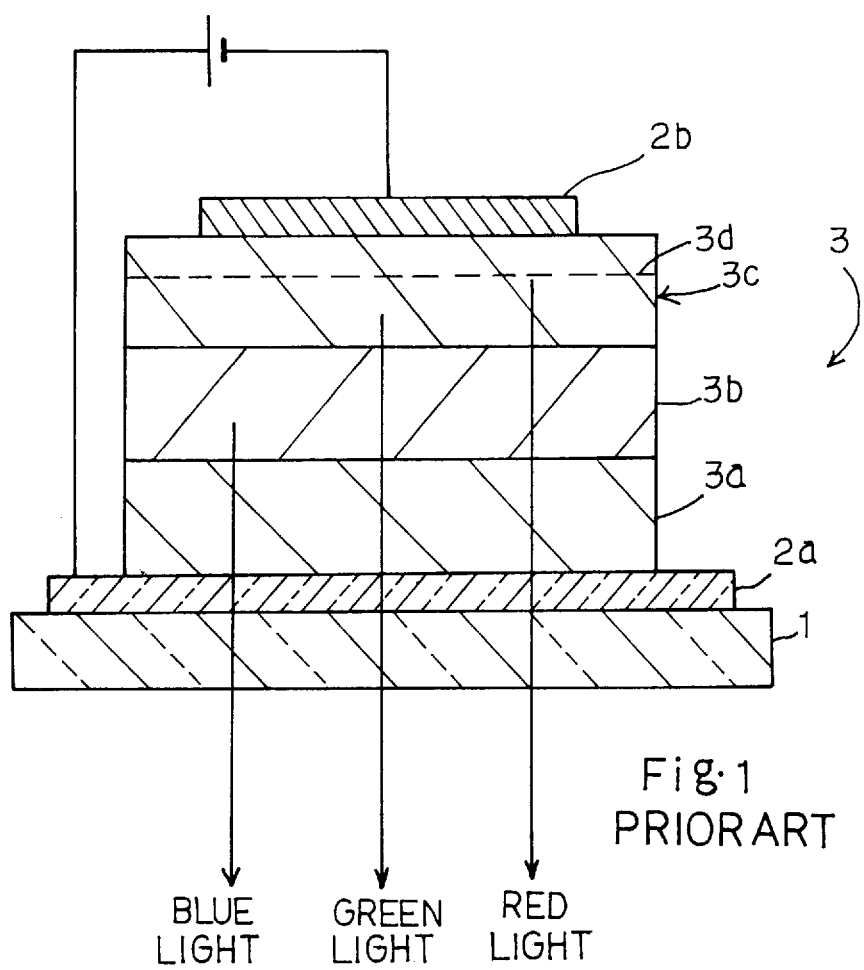
FIG. 1 is a cross sectional view showing the structure of the prior art organic electroluminescent element disclosed in Japanese Patent Publication of Unexamined Application No. 7-142169.

The first comparative sample had the arrangement of electrode shown in FIG. 1. A glass substrate was sufficiently cleaned, and a semi-transparent anode of SnO$_2$ was formed thereon. α-NPD was deposited to 35 nanometers thick so as to form a hole transporting layer on the semi-transparent anode. A host material of DPVBi and a guest material of BczVBi were deposited to 35 nanometers thick in ultra high vacuum in such a manner as to contain the guest material at 3.1 mol % with respect to the host material, and formed an organic luminescent layer for blue light.

Subsequently, Alq was deposited to 35 nanometers thick on the organic luminescent layer in the ultra high vacuum, and a host material of Alq and a guest material of DCM were deposited to 30 nanometers thick on the Alq layer in the ultra high vacuum, and the DCM was 1.8 mol % with respect to Alq.

An aluminum alloy target containing scandium at 1 mol % was evaporated in argon gas by using an RF sputtering, and lithium was concurrently evaporated by using a resistance heating evaporation technique. As a result, a cathode of 20 nanometers thick was formed on the organic luminescent medium for the red light, and contained lithium at 0.3 mol %. Finally, aluminum alloy containing scandium at 1 mol % was deposited to 300 nanometers thick by using the rf sputtering in argon gas, and the cathode was covered with a protective layer.

A direct current source was connected between the semi-transparent anode and the cathode. When the bias voltage was adjusted to 10 volts, the first comparative sample achieved 1270 cd/m$^2$, and the emitted light at 100 cd/m$^2$ had the chromaticity at X=0.267 and Y=0.458 in the CIE chromaticity coordinates. The emitted light was not white.

Second Comparative Sample

The second comparative sample had the arrangement of electrodes shown in FIG. 1. A clean glass substrate was prepared, and SnO$_2$ was deposited so as to form a semi-transparent anode on the glass substrate. CuPc was deposited to 25 nanometers thick so as to form a hole injecting layer on the semi-transparent anode, and mixture of PVK, DPVBi and BczVBi was spun onto the hole injecting layer for forming an organic luminescent layer for blue light. DPVBi and BczVBi were regulated to 100:3 by mol, and the organic luminescent layer was 70 nanometers thick. Other fabrication steps were similar to those of the first comparative sample.

The second comparative sample achieved 970 cd/m$^2$ at 10 volts, and the emitted light at 100 cd/m$^2$ had the chromaticity at X=0.277 and Y=0.450 in the CIE chromaticity coordinates. The emitted light was not white.

Third Comparative Sample

Figure 2:
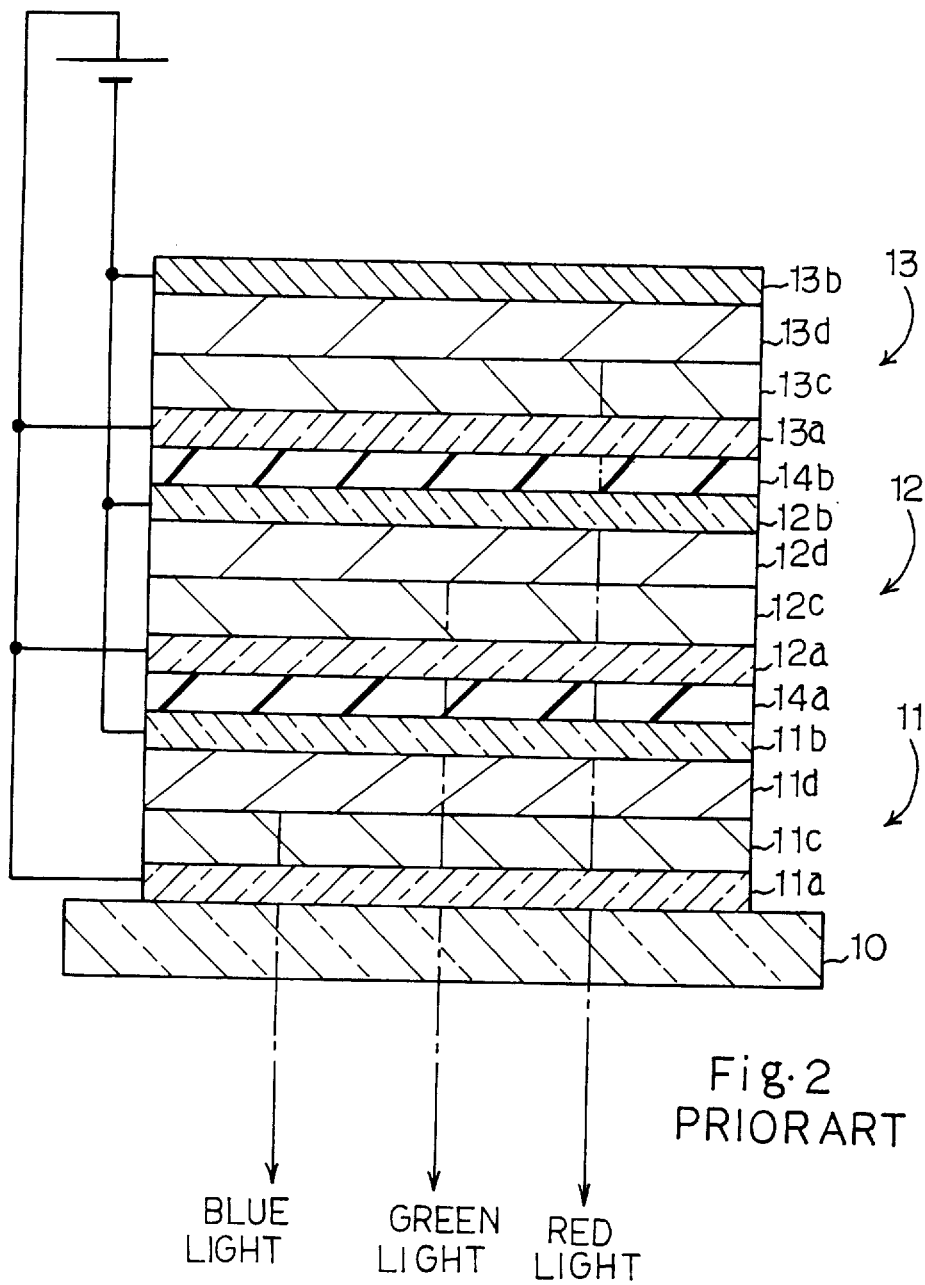
FIG. 2 is a cross sectional view showing the structure of the prior art organic electroluminescent element disclosed in Japanese Patent Publication of Unexamined Application No. 7-57873.

The third comparative sample had the arrangement of electrodes shown in FIG. 2. A glass substrate was cleaned, and indium-tin-oxide was deposited so as to form a semi-transparent anode on the glass substrate. CuPc was deposited to 5 nanometers thick so as to form a hole injecting layer on the semi-transparent anode. Alpha-NPD was deposited to 40 nanometers thick in high vacuum so as to form a hole transporting layer on the hole injecting layer. DPVBi and BczVBi were deposited to 45 nanometers thick on the hole transporting layer in the ultra high vacuum, and BczVBi was 3.1 mol % with respect to DPVBi so s to form an organic luminescent layer for blue light.

Subsequently, Alq was deposited to 20 nanometers thick so as to form an electron transporting layer on the organic luminescent layer, and SrO was deposited to 0.5 nanometer thick so as to form a semi-transparent cathode on the electron transporting layer. Indium-zinc was deposited on the semi-transparent cathode through the low-temperature process, and the indium-zinc layer served as a transparent electrode. Thus, the first organic luminescent cell for blue light was obtained.

GeO was deposited to 25 nanometers thick on the organic luminescent cell so as to electrically isolate the first organic luminescent cell from a second organic luminescent cell for green light.

Subsequently, indium-zinc alloy was deposited over the Geo layer so as to form a semi-transparent anode, and alpha-NPD was deposited to 50 nanometers thick so as to form a hole transporting layer on the semi-transparent anode. Alq was deposited to 50 nanometers thick on the hole transporting layer for forming an organic luminescent layer for green light. SrO was deposited to 0.5 nanometer thick so as to form a semi-transparent cathode on the organic luminescent layer, and a transparent electrode of indium-zinc was laminated on the semi-transparent cathode. The second organic luminescent cell for green light was fabricated on the first organic luminescent cell for blue light.

GeO was deposited to 25 nanometers thick on the second organic luminescent cell, and the GeO layer electrically isolated the second organic luminescent cell from a third organic luminescent cell for red light.

A semi-transparent anode of indium-zinc was formed on the GeO layer, and alpha-NPD was deposited to 50 nanometers thick so as to form a hole transporting layer on the semi-transparent anode. Alq and DCM were deposited to 50 nanometers thick in the high vacuum in such a manner as to contain DCM at 1.8 mol % with respect to Alq.

An aluminum alloy target containing scandium at 1 mol % was evaporated in argon gas by using an rf sputtering, and lithium was concurrently evaporated by using a resistance heating evaporation technique. As a result, a cathode of 20 nanometers thick was formed on the third organic luminescent cell for the red light, and contained lithium at 0.3 mol %. Finally, aluminum alloy containing scandium at 1 mol % was deposited to 300 nanometers thick by using the rf sputtering in argon gas, and the cathode was covered with a protective layer.

A direct current source was connected between the semi-transparent anodes and the semi-transparent cathodes/cathode. When the bias voltage was adjusted to 10 volts, the first comparative sample achieved 850 cd/m$^2$, and the emitted light at 100 cd/m$^2$ had the chromaticity at X=0.286 and Y=0.495 in the CIE chromaticity coordinates. The emitted light was not white.

Fourth Comparative Sample

The fourth comparative sample was similar to the third comparative sample except for the followings. Indium-tin-oxide was deposited on a glass substrate for forming a semi-transparent anode, and CuPc was deposited to 25 nanometers thick so as to form a hole injecting layer. Mixture of PVK, DPVBi and BczVBi was spun thereonto in such a manner as to regulate DPVBi and BczVBi to 100:3 by mol, and an organic luminescent layer of 70 nanometers thick was formed. On the organic luminescent layer was deposited Alq which formed an electron transporting layer of 20 nanometers thick.

The fourth comparative sample achieved 525 cd/m$^2$ at 10 volts, and the emitted light at 100 cd/m$^2$ had the chromaticity at X=0.283 and Y=0.461 in the CIE chromaticity coordinates. The emitted light was not white.

As will be appreciated from the foregoing description, the semi-transparent anode or the semi-transparent cathode at the boundary between the organic luminescent media surely improves the luminance of the organic electroluminescent element according to the present invention. The emitted light is surely white, because the luminances of the blue light, the green light and the red light are well controlled.

Although particular embodiments of the present invention have been shown and described, it will be obvious to those skilled in the art that various changes and modifications may be made without departing from the spirit and scope of the present invention.

For example, the electrode on the substrate and the electrode on the multi-layer structure may be non-transparent and transparent, respectively so as to emit the composite light through the transparent electrode on the multi-layer structure.

Figure 18:
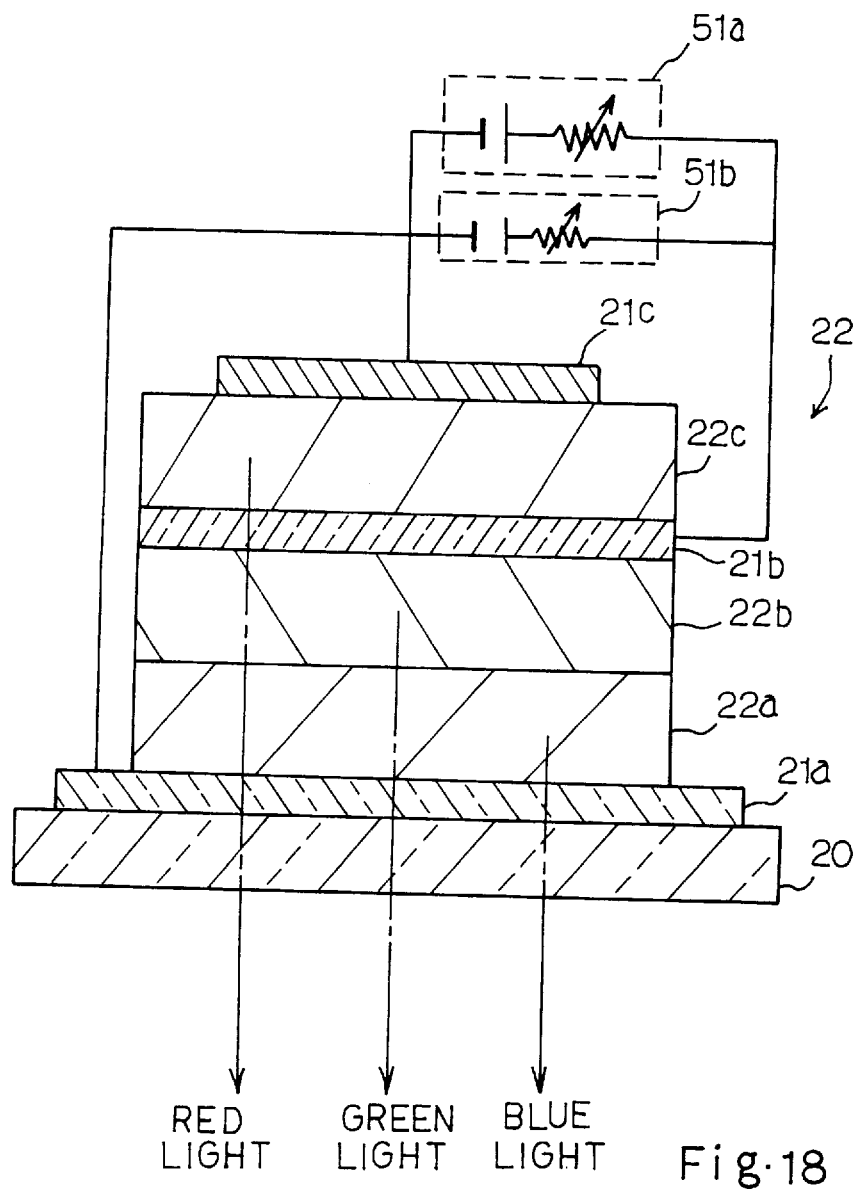
FIG. 18 is a cross sectional view showing the structure of a modification of the organic electroluminescent element shown in FIG. 3.
Figure 19:
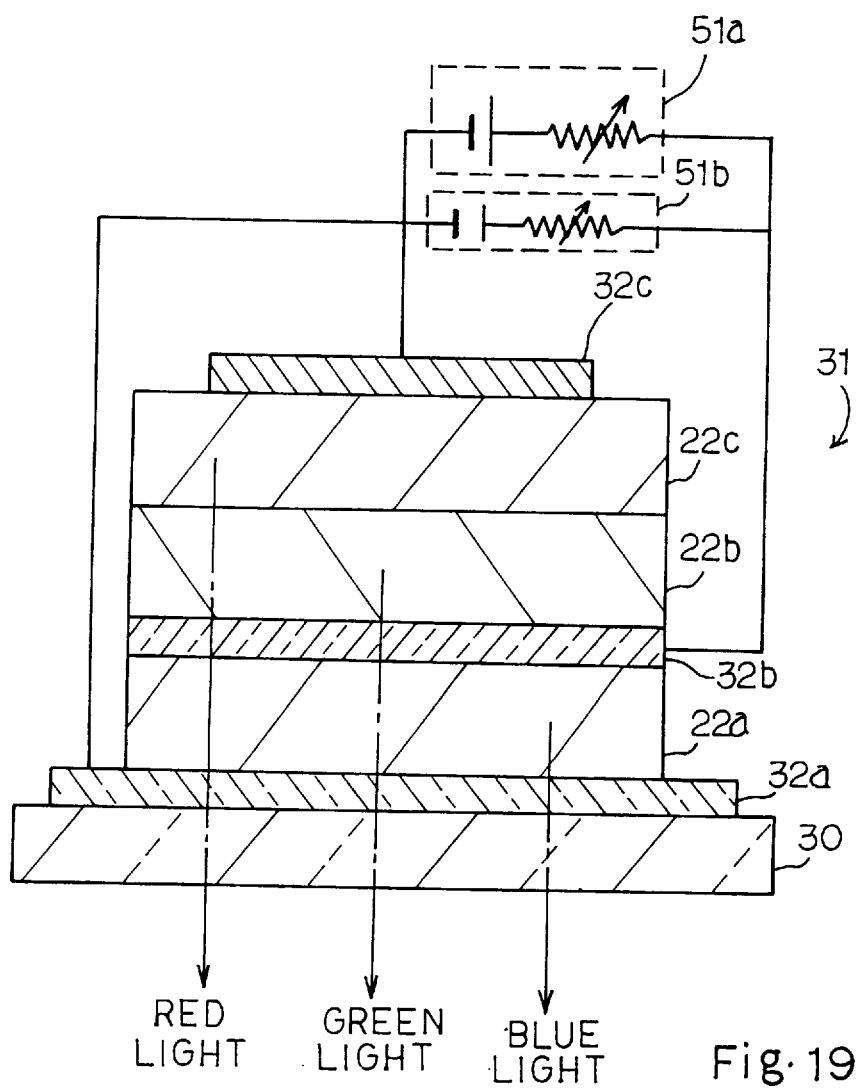
FIG. 19 is a cross sectional view showing the structure of a modification of the organic electroluminescent element shown in FIG. 4.
Figure 20:
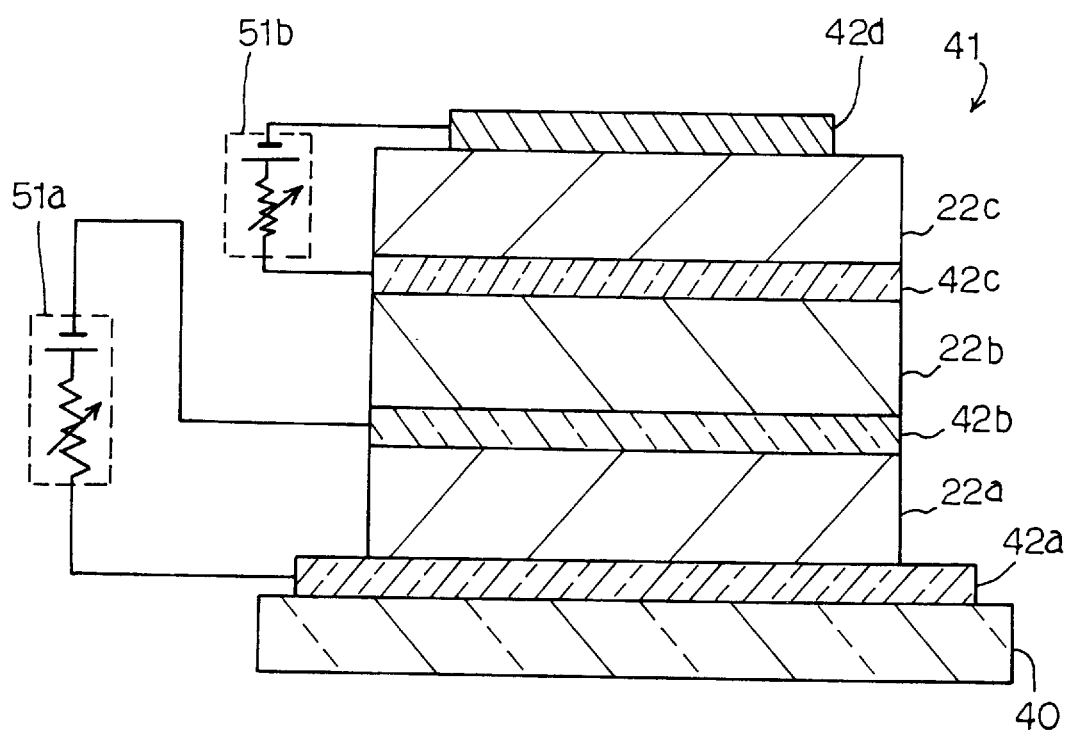
FIG. 20 is a cross sectional view showing the structure of a modification of the organic electroluminescent element shown in FIG. 5.

The organic electroluminescent elements shown in FIGS. 3 to 5 are driven by a single electric power source 23 to 43. However, more than one electric power source 51a/51b may drive the organic electroluminescent elements as shown in FIGS. 18 to 20. The electric power supplies 51a and 51b allow the manufacturer to exactly control the potential difference applied to the luminescent media, and the luminances of emitted lights are strictly regulated to a target value.

The organic electroluminescent element according to the present invention may be covered with a sealing layer of inorganic compound such metal oxide, metal sulfide or metal fluoride or organic compound. The sealing layer prevents the organic electroluminescent element from oxygen and water vapor, and imparts a durability to the organic electroluminescent element.

What is claimed is:

1. An organic electroluminescent element comprising:
    a multi-layer structure having a plurality of thin films which form a plurality of boundaries therebetween, said plurality of thin films including
    a first organic luminescent layer for emitting light in a first color,
    a second organic luminescent layer for emitting light in a second color different from said first color,
    a third organic luminescent layer for emitting light in a third color different from said first and second colors; and
    a plurality of electrodes selectively connected to a first source of power voltage and a second source of power voltage different in potential level from said first source of power voltage for applying potentials to said first, second and third organic luminescent layers, and including at least one electrode provided at one of said plurality of boundaries for injecting first electric charges into two of said first, second and third organic luminescent layers and other electrodes injecting second electric charges opposite in polarity to said first electric charges into said two of said first, second and third organic luminescent layers.

2. The organic electroluminescent element as set forth in claim 1, in which said multi-layer structure is sandwiched between said other electrodes.

3. The organic electroluminescent element as set forth in claim 2, in which said at least one electrode is inserted between said second organic luminescent layer for green light and said third organic luminescent layer for red light for injecting holes into said second and third organic luminescent layers, and said other electrodes inject electrons into said first and second organic luminescent layers and said third organic luminescent layer so as to emit a blue light, a green light and a red light from said first, second and third organic luminescent layers through a recombination between said holes and said electrons.

4. The organic electroluminescent element as set forth in claim 3, in which said plurality of thin films further include hole transporting layers inserted between said at least one electrode and said second and third organic luminescent layers.

5. The organic electroluminescent element as set forth in claim 4, in which said plurality of thin films further include blocking layers inserted between said hole transporting layers and said second and third organic luminescent layers so as to confine excitons generated in said first, second and third organic luminescent layers.

6. The organic electroluminescent element as set forth in claim 4, in which said plurality of thin films further include hole injecting layers between said at least one electrode and said hole transporting layers for stably injecting said holes into said second and third organic luminescent layers.

7. The organic electroluminescent element as set forth in claim 3, in which said plurality of thin films further include electron injecting and electron transporting layers between said other electrodes and said first and third organic luminescent layers, respectively.

8. The organic electroluminescent element as set forth in claim 2, in which said at least one electrode is inserted between said first organic luminescent layer for blue light and said second organic luminescent layer for green light for injecting holes into said first and second organic luminescent layers, and said other electrodes inject electrons into said first organic luminescent layer and said second and third organic luminescent layers so as to emit a blue light, a green light and a red light from said first, second and third organic luminescent layers through a recombination between said holes and said electrons.

9. The organic electroluminescent element as set forth in claim 8, in which said plurality of thin films further include hole transporting layers inserted between said at least one electrode and said first and second organic luminescent layers.

10. The organic electroluminescent element as set forth in claim 9, in which said plurality of thin films further include blocking layers inserted between said hole transporting layers and said first and second organic luminescent layers so as to confine excitons generated in said first, second and third organic luminescent layers.

11. The organic electroluminescent element as set forth in claim 9, in which said plurality of thin films further include hole injecting layers between said at least one electrode and said hole transporting layers for stably injecting said holes into said first and second organic luminescent layers.

12. The organic electroluminescent element as set forth in claim 1, in which one of said other electrodes is provided at another of said plurality of boundaries, and said multilayer structure is sandwiched between another of said other electrodes and yet another electrode.

13. The organic electroluminescent element as set forth in claim 12, in which said at least one electrode and said yet another electrode inject electrons into said first, second and third organic luminescent layers, and said one of said other electrodes and said another of said other electrodes inject holes into said first, second and third organic luminescent layers so as to emit a blue light, a green light and a red light from said first, second and third organic luminescent layers through a recombination of said holes and said electrons.

14. The organic electroluminescent element as set forth in claim 13, in which said at least one electrode and said one of said other electrodes are inserted between said first organic luminescent layer and said second organic luminescent layer and between said second organic luminescent layer, respectively and said third organic luminescent layer.

15. The organic electroluminescent element as set forth in claim 14, in which said plurality of thin films further include hole transporting layers between said another of said other electrodes and said first organic luminescent layer and between said one of said other electrodes and said second and third organic luminescent layers.

16. The organic electroluminescent element as set forth in claim 15, in which said plurality of thin films further include blocking layers between the hole transporting layers and said first, second and third organic luminescent layers.

17. The organic electroluminescent element as set forth in claim 15, in which said plurality of thin films further include hole injecting layers between said another of said other electrodes and the hole transporting layer held in contact with said first organic luminescent layer and between said one of said other electrodes and the hole transporting layers respectively held in contact with said second and third organic luminescent layers.

18. The organic electroluminescent layer as set forth in claim 14, in which said plurality of thin films further include electron injecting and electron transporting layers between said at least one electrode and said first and second organic luminescent layers and between said yet another electrode and said third organic luminescent layer.

* * * * *